(12) United States Patent
Pratt et al.

(10) Patent No.: US 11,133,854 B1
(45) Date of Patent: Sep. 28, 2021

(54) DIGITAL PREDISTORTION USING CODING FOR PHASED ANTENNA ARRAYS

(71) Applicant: Analog Devices International Unlimited Company, Limerick (IE)

(72) Inventors: Patrick Pratt, Mallow (IE); Ahmed Hassan Abdelaziz Abdelrahman, Greensboro, NC (US); John Oates, Thomasville, NC (US); Bijan Knight Tehrani, Atlanta, GA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/073,908

(22) Filed: Oct. 19, 2020

(51) Int. Cl.
| | |
|---|---|
| *H04L 5/12* | (2006.01) |
| *H04B 7/06* | (2006.01) |
| *H04B 7/0456* | (2017.01) |
| *H04B 7/0426* | (2017.01) |
| *H04B 7/0417* | (2017.01) |

(52) U.S. Cl.
CPC ........... *H04B 7/0639* (2013.01); *H04B 7/043* (2013.01); *H04B 7/0417* (2013.01); *H04B 7/0482* (2013.01)

(58) Field of Classification Search
CPC .... H04B 7/0639; H04B 7/0417; H04B 7/043; H04B 7/0482
USPC ................ 375/262, 261, 259, 219, 295, 316
See application file for complete search history.

(56) References Cited

U.S. PATENT DOCUMENTS

| | | | |
|---|---|---|---|
| 6,084,454 A | 7/2000 | Lier et al. | |
| 7,313,199 B2 | 12/2007 | Gupta et al. | |
| 7,336,716 B2 | 2/2008 | Maltsev et al. | |
| 8,045,926 B2 | 10/2011 | Martikkala et al. | |
| 9,258,081 B2 | 2/2016 | Mahoney et al. | |
| 9,509,331 B1 | 11/2016 | Pagnanelli | |
| 2020/0259465 A1* | 8/2020 | Wu | H04B 1/0475 |

OTHER PUBLICATIONS

Silverstein, *Application of Orthogonal Codes to the Calibration of Active Phased Array Antennas for Communication Satellites*, IEEE Transactions on Signal Processing, vol. 45, No. 1, Jan. 1997, 13 pages.

(Continued)

*Primary Examiner* — Zewdu A Kassa
(74) *Attorney, Agent, or Firm* — Patent Capital Group

(57) ABSTRACT

Digital predistortion (DPD) arrangements that use coding to differentiate between contributions from individual power amplifiers (PAs) is disclosed. When used with a phased antenna array having N antenna elements and N corresponding PAs, the arrangements may sequentially apply N codes to input signals provided to N PAs. Each code is a vector having N elements, where each element corresponds to a different PA in that the element is a complex gain applied to an input signal for the PA. Together, the N codes may be arranged as N rows or N columns of a matrix P. The disclosed arrangements may generate N feedback signals by applying the matrix P to a signal generated by a probe antenna element sensing wireless RF signals transmitted by the N antenna elements, and to update DPD coefficients based on the N feedback signals. The N codes may be either orthogonal or non-orthogonal.

30 Claims, 25 Drawing Sheets

(56) References Cited

OTHER PUBLICATIONS

Quindroit et al., *FPGA Implementation of Orthogonal 2D Digital Predistortion System for Concurrent Dual-Band Power Amplifiers Based on Time-Division Multiplexing,* IEEE Transactions on Microwave Theory and Techniques, vol. 61, No. 12, Dec. 2013, 9 pages.
Yan et al., *Digital Predistortion for Hybrid Precoding Architecture in Millimeter-Wave Massive Mimo Systems,* 978-1-5090-4117-6 © 2017 IEEE, 5 pages.
Liu et al., *Linearization for Hybrid Beamforming Array Utilizing Embedded Over-the-Air Diversity Feedbacks,* IEEE Transactions on Microwave Theory and Techniques, vol. 67, No. 12, Dec. 2019, 14 pages.
Ayed et al., *On the Effectiveness of Near-Field Feedback for Digital Pre-Distortion of Millimeter-Wave RF Beamforming Arrays,* We1F-3, 978-1-7281-6815-9 © 2020 IEEE, 4 pages.
Ng, *Digital Predistortion of Millimeter-Wave Phased Antenna Arrays,* Thesis, presented to the University of Waterloo, Waterloo, Ontario, Canada, © 2018, 94 pages.
Ayed et al., *On the Effectiveness of Near-Field Feedback for Digital Pre-Distortion of Millimeter-Wave RF Beamforming Arrays,* International Microwave Symposium, Jun. 21-26, 2020, 16 pages.

\* cited by examiner $$P = \begin{bmatrix} e^{i\psi_{11}} & \cdots & e^{i\psi_{1N}} \\ \vdots & \cdots & \vdots \\ e^{i\psi_{N1}} & \cdots & e^{i\psi_{NN}} \end{bmatrix}$$

DIGITAL PREDISTORTION USING CODING FOR PHASED ANTENNA ARRAYS

TECHNICAL FIELD OF THE DISCLOSURE

The present disclosure generally relates to electronics, and, more specifically, to performing digital predistortion in radio frequency (RF) systems that employ phased antenna arrays.

BACKGROUND

Radio systems are systems that transmit and receive signals in the form of electromagnetic waves in the RF range of approximately 3 kilohertz (kHz) to 300 gigahertz (GHz). Radio systems are commonly used for wireless communications, with cellular/wireless mobile technology being a prominent example but may also be used for cable communications such as cable television. In both of these types of systems, linearity of various components therein plays a crucial role.

Linearity of an RF component or a system such as an RF transceiver is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency and/or output power.

Made from semiconductor materials, which are inherently nonlinear, and having to operate at relatively high power levels, power amplifiers (PAs) are usually the first components to analyze when considering a design of an RF system in terms of linearity. Power amplifier (PA) outputs with nonlinear distortions can result in reduced modulation accuracy (e.g., reduced error vector magnitude (EVM)) and/or out-of-band emissions. Therefore, both wireless RF systems (e.g., Long Term Evolution (LTE) and millimeter-wave or $5^{th}$ generation (5G) systems) and cable RF systems have stringent specifications on PA linearity.

Digital predistortion (DPD) can be applied to enhance linearity of a PA. Typically, DPD involves applying, in the digital domain, predistortion to a signal to be provided as an input to a PA to reduce and/or cancel distortion that is expected to be caused by the PA. The predistortion can be characterized by a PA model. The PA model can be updated based on the feedback from the PA (i.e., based on the output of the PA). The more accurate a PA model is in terms of predicting the distortions that the PA will introduce, the more effective the predistortion of an input to the PA will be in terms of reducing the effects of the distortion caused by the amplifier.

Performing DPD in any state-of-the art RF system is not an easy task because a variety of factors can affect the cost, quality and robustness of DPD. Physical constraints such as space/surface area and also regulations can pose further constraints to the requirements or specifications of DPD. DPD becomes particularly challenging for wireless RF systems employing phased antenna arrays, and thus trade-off and ingenuity have to be exercised in designing DPD for phased antenna arrays.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 5A and 5B provide example illustrations of, respectively, an orthogonal and a non-orthogonal matrix P, according to some embodiments of the present disclosure;

DESCRIPTION OF EXAMPLE EMBODIMENTS OF THE DISCLOSURE

Overview

Figure 1:
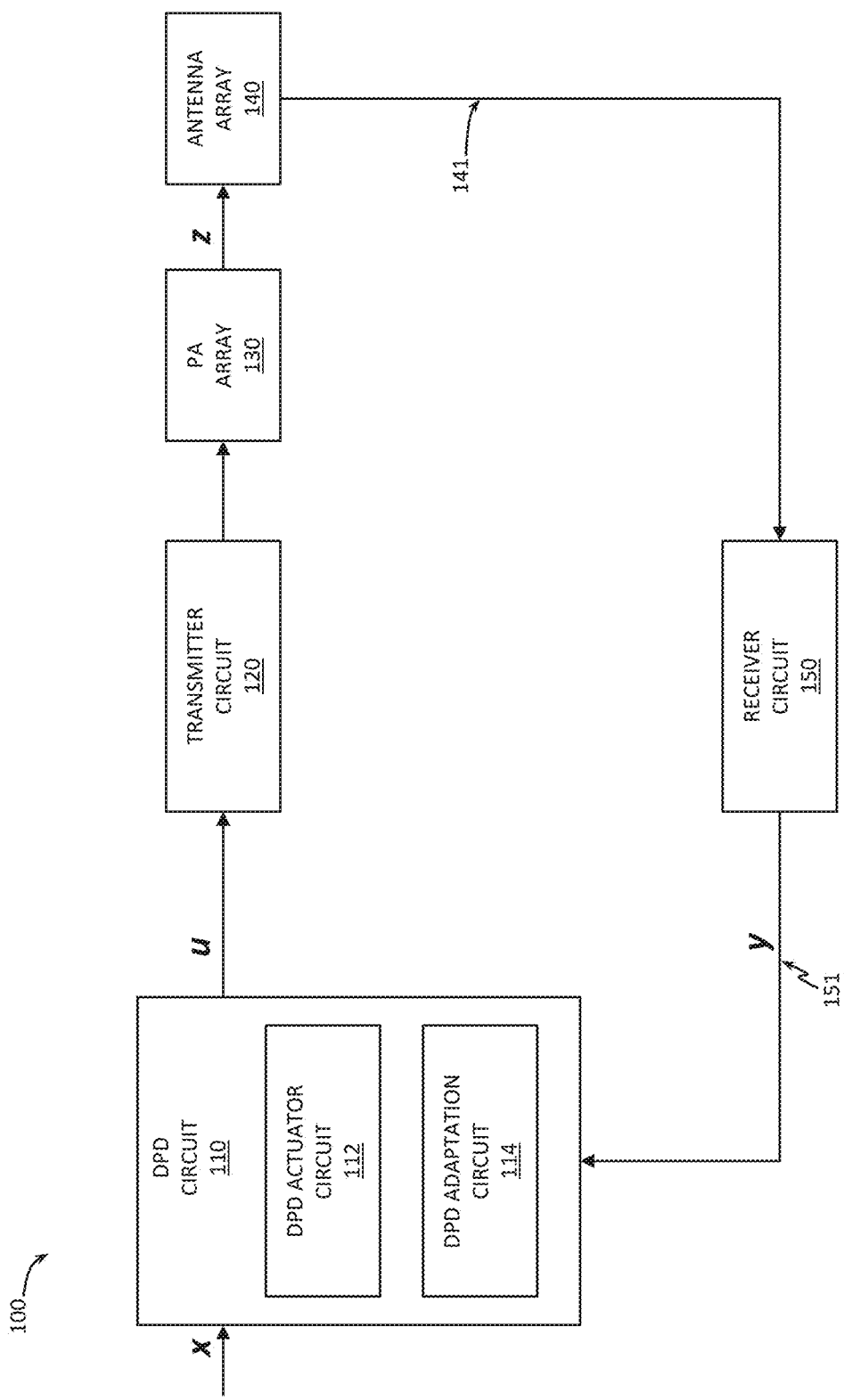
FIG. 1 provides a schematic block diagram of an RF transceiver in which DPD using coding for phased antenna arrays may be implemented, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating DPD using coding for phased antenna arrays, proposed herein, it might be useful to first understand phenomena that may come into play in wireless RF systems. The following foundational information may be viewed as a basis from which the present disclosure may be properly explained. Such information is offered for purposes of explanation only and, accordingly, should not be construed in any way to limit the broad scope of the present disclosure and its potential applications.

In context of wireless RF systems, antenna is a device that serves as an interface between radio waves propagating wirelessly through space and electric currents moving in metal conductors used in a transmitter, a receiver, or a transceiver. During transmission, a transmitter circuit of an RF transceiver may supply an electric signal, which signal is amplified by a PA, and an amplified version of the signal is provided to antenna's terminals. The antenna may then radiate the energy from the signal output by the PA as radio waves. Antennas are essential components of all radio equipment, and are used in radio broadcasting, broadcast television, two-way radio, communications receivers, radar, cell phones, satellite communications and other devices.

An antenna with a single antenna element will typically broadcast a radiation pattern that radiates equally in all directions in a spherical wavefront. Phased antenna arrays generally refer to a collection of antenna elements that are used to focus electromagnetic energy in a particular direction, thereby creating a main beam, a process commonly referred to as "beamforming." Phased antenna arrays offer numerous advantages over single antenna systems, such as high gain, ability to perform directional steering, and simultaneous communication. Therefore, phased antenna arrays are being used more frequently in a myriad of different applications, such as mobile/cellular wireless technology, military applications, airplane radar, automotive radar, industrial radar, and Wi-Fi technology.

As described above, PAs are usually the first components to analyze when considering a design of an RF system in terms of linearity. Having linear and efficient PAs is essential for wireless RF systems. While linearity is also important for small-signal amplifiers such as low-noise amplifiers, the challenges of linearity are particularly pronounced for PAs because such amplifiers are typically required to produce relatively high levels of the output power and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating at relatively high power levels (i.e., operating in saturation) also typically function at their highest efficiency, which is highly desirable. As a result, linearity and efficiency (or power level) are two performance parameters for which, often, an acceptable trade-off has to be found in that an improvement in terms of one of these parameters comes at the expense of the other parameter being suboptimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Thus, reducing the input power may provide an improvement in terms of linearity but results in a decreased efficiency of the amplifier.

Performing DPD is particularly challenging for wireless RF systems employing phased antenna arrays because such systems employ multiple PAs (e.g., a different PA may be used for each of the antenna elements of a phased antenna array). First of all, multiple PAs of a phased antenna array may differ in their intrinsic nonlinear behavior properties. Second, the PAs may be driven with different power levels and biased by different signals, which may further affect their nonlinear behavior. It has been recognized that being able to differentiate between contributions from individual PAs in a feedback signal used to train DPD would be beneficial for coming up with a better approximation of the nonlinear behavior of an array of PAs. Consequently, multiple solutions have been proposed, such as solutions using a designated receiver for each PA of an array, solutions that test the nonlinear behavior of individual PAs sequentially, solutions employing an OTA far-field antenna receiver in the main beam direction, solutions deliberately steering the beam towards a near-field probe, etc.

Inventors of the present disclosure realized that all of the conventional solutions for differentiating between contributions from individual PAs in a feedback signal used to train DPD for a phased antenna array system have shortcomings and still impede widespread adoption of DPD in such systems. For example, using a designated receiver for each PA of an array is costly and complex, testing the nonlinear behavior of individual PAs sequentially is time-consuming and does not allow testing an overall behavior of a system when all PAs are active and beamforming is performed, having an OTA antenna receiver in the main beam direction is impractical, deliberately steering the beam towards a near-field probe changes the beam pattern which prevents testing of how a system would behave in real-life settings when beamforming is performed, etc.

Various embodiments of the present disclosure provide systems and methods that aim to improve on one or more of the drawbacks described above in providing linear and efficient amplifiers (such as, but not limited to, PAs) for RF systems (such as, but not limited to, beamforming antenna array systems of millimeter-wave/5G technologies). In particular, embodiments of the present disclosure provide a DPD arrangement that utilizes encoding (the arrangement referred to, therefore as a "coded DPD arrangement") to differentiate between contributions from individual PAs in a feedback signal used to update a DPD model for a phased antenna array system. When used with a phased antenna array having N antenna elements (where N is an integer greater than 1) configured to transmit wireless signals based on outputs from corresponding ones of N PAs of a PA array, a beamformer circuit of the coded DPD arrangement is configured to sequentially apply N codes to input signals provided to the N PAs and, hence, may be referred to as a "coded beamformer circuit." Each of the N codes is a vector having N elements (i.e., a 1×N matrix), where each element corresponds to a different PA in that the element is a complex gain (i.e., a parameter that may modify one or more of an amplitude and a phase of an input signal), a frequency encoding, or a combination of a complex gain and a frequency encoding, applied to an input signal for the PA. Together, the N codes may be arranged as N rows or N columns of a matrix P (i.e., the matrix P may be a square matrix N×N). The coded DPD arrangement may further include a DPD adaptation circuit, configured to generate N feedback signals ($y_n$, where n is an integer between 1 and N) by applying the matrix P to a digital signal based on a signal generated by a probe antenna element configured to sense wireless RF signals transmitted by at least a subset of the N antenna elements based on the signals to which the coded beamformer circuit applied the N codes, and to update DPD coefficients ($\theta$) based on the N feedback signals. In some embodiments, the N codes may be non-orthogonal codes in that the matrix P may be such that a 2-norm of a matrix that is a result of subtracting an identity matrix from a multiple of a Hermitian transpose of the matrix P by the matrix P is greater than zero. Thus, as used herein, N codes are referred to as "orthogonal" when their matrix P is such that a 2-norm of a matrix that is a result of subtracting an identity matrix from a multiple of a Hermitian transpose of the matrix P by the matrix P is equal to zero.

Various embodiments of performing DPD using coding for phased antenna arrays are explained herein with reference to the "input signals for PAs" being drive signals for the PAs, i.e., signals generated on the basis of the input signal x, described herein, to which the coded DPD arrangement applies predistortion based on the DPD coefficients. However, in other embodiments of DPD using coding for phased antenna arrays, the "input signals for PAs" may be bias signals used to bias the N PAs. Thus, embodiments of the present disclosure include coded DPD arrangements similar to the ones described herein and illustrated in the drawings, except that, instead of modifying the drive signals for the PAs, DPD circuit may be configured to modify the bias signals for the PAs, which may be done based on control signals generated by a DPD adaptation circuit (e.g., the DPD adaptation circuit 114, described herein). The output of the PA array is based on the bias signals used to bias the array of PAs individually or collectively. In other aspects of the present disclosure, both drive signals and bias signals for the PA array may be adjusted as described herein to implement of DPD using coding for phased antenna arrays.

Furthermore, while some of the descriptions are provided herein with the coded beamformer circuit applying the N codes as complex gains, these descriptions are equally applicable to the coded beamformer circuit applying the N codes to the N PA input signals as complex gains, frequency encoding, or a combination of complex gains and frequency encoding.

Still further, while some of the descriptions are provided herein with reference to PAs, in general, various embodiments of DPD using coding for phased antenna arrays, presented herein, are applicable to amplifiers other than PAs, such as low-noise amplifiers, variable gain amplifiers, etc., as well as to nonlinear electronic components of RF transceivers (i.e., components that may exhibit nonlinear behavior) other than amplifiers. Furthermore, while some of the descriptions are provided herein with reference to beamforming antenna array systems of millimeter-wave/5G technologies, in general, various embodiments of DPD using coding for phased antenna arrays, presented herein, are applicable to beamforming antenna array systems of any technology or standard other than millimeter-wave/5G, and/or to any wireless RF systems employing phased antenna arrays, other than wireless communication systems.

As will be appreciated by one skilled in the art, aspects of the present disclosure, in particular aspects of RF transceivers with DPD using coding for phased antenna arrays as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g. to various components and arrangements of components of RF transceivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a DPD actuator circuit 112 shown in the present drawings may be referred to in the present descriptions as a "DPD actuator 112," etc.). If used, the terms "substantially," "approximately," "about," etc., may be used to generally refer to being within +/−20% of a target value, e.g., within +/−10% of a target value, based on the context of a particular value as described herein or as known in the art.

Example RF Transceivers with Coded DPD Arrangements

FIG. 1 provides a schematic block diagram of an RF transceiver 100 in which DPD using coding for phased antenna arrays may be implemented, according to some embodiments of the present disclosure. As shown in FIG. 1, the RF transceiver 100 may include a DPD circuit 110, a transmitter circuit 120, a PA array 130, an antenna array 140, and a receiver circuit 150.

The DPD circuit 110 is configured to receive an input signal x, which may be a sequence of digital samples and which may be a vector. In general, as used herein, each of the lower case, bold italics single-letter labels used in the present figures (e.g., labels x, u, and y, shown in FIG. 1), refers to a vector. In some embodiments, the input signal x may include one or more active channels in the frequency domain, but, for simplicity, an input signal with only one channel (i.e., a single frequency range of in-band frequencies) is described. In some embodiments, the input signal x may be a baseband digital signal. The DPD circuit 110 is configured to generate an output signal u based on the input signal x, which output signal may then be provided further to the transmitter circuit 120. To that end, the DPD circuit 110 may include a DPD actuator 112 and a DPD adaptation circuit 114. In some embodiments, the actuator 112 may be configured to generate the output signal u based on the input signal x and DPD coefficients θ, computed by the DPD adaptation circuit 114, as described in greater detail below.

The transmitter circuit 120 may be configured to upconvert the signal u from a baseband signal to a higher frequency signal, such as an RF signal. The RF signal generated by the transmitter circuit 120 may be provided to the PA array 130 which may include N PAs. Each of the N PAs of the PA array 130 may be configured to amplify the RF signal generated by the transmitter 120 (thus, the PA array 130 may be driven by a drive signal that is based on the output of the DPD circuit 110) and output a respective amplified RF signal z (which may be a vector). The amplified RF signal z can be provided to a corresponding antenna element of the antenna array 150 to be wirelessly transmitted.

The RF transceiver 100 further includes a beamformer arrangement, configured to vary the input signals provided to the individual PAs of the PA array 130 to steer the beam generated by the antenna array 140. Such a beamformer arrangement is not specifically shown in FIG. 1 because it may be implemented in different manners, e.g., as an analog beamformer (i.e., where the input signals to be amplifier by the PA array 130 are modified in the analog domain, i.e., after these signals have been converted from the digital domain to the analog domain), as a digital beamformer (i.e., where the input signals to be amplifier by the PA array 130 are modified in the digital domain, i.e., before these signals are converted from the digital domain to the analog domain), or as a hybrid beamformer (i.e., where the input signals to be amplifier by the PA array 130 are modified partially in the digital domain and partially in the analog domain). Examples of such beamformer arrangements are shown in some of the subsequent drawings.

Ideally, the amplified RF signal z from each of the PAs of the PA array 130 should just be an upconverted and amplified version of the output of the transmitter circuit 120, e.g., an upconverted, amplifier, and beamformed version of the input signal x. However, as discussed above, the amplified RF signals z can have distortions outside of the main signal components. Such distortions can result from nonlinearities in the response of the PA array 130. As discussed above, it can be desirable to reduce such nonlinearities. Accordingly, the RF transceiver 100 may further include at least one probe antenna element, configured to sense wireless RF signals transmitted by at least a subset of the antenna elements of the antenna array 140 and generate appropriate electrical signals. In various embodiments, a probe antenna element may either be one of the N antenna elements of the phased antenna array or be an additional antenna element (e.g., a calibration probe, i.e., an additional antenna element used for calibration of the phased antenna array) that may be provided in the vicinity of (e.g., on a single substrate with) the N antenna elements of the antenna array 140. At least a portion of the sensed output from the probe antenna element may be provided, as a feedback signal 141, to the receiver circuit 150. The output of the receiver circuit is coupled to the DPD circuit 110, in particular, to the DPD adaptation circuit 114. In this manner, an output signal y of the receiver circuit 150, which is a signal based on the feedback signal 141 indicative of the signal generated by one or more probe antenna elements, which, in turn, is indicative of the outputs from the PA array 130, may be provided to the DPD adaptation circuit 114 by way of the receiver circuit 150. The DPD adaptation circuit 114 may process the received signals and update DPD coefficients θ applied by the DPD actuator circuit 112 to the input signal x to generate the actuator output u. A signal based on the actuator output u is provided as an input to the PA array 130, meaning that the actuator output u may be used to control the operation of the PA array 130.

In general, the RF transceiver 100 may be any device/apparatus or system configured to support wireless transmission and reception of signals in the form of electromagnetic waves in the RF range of approximately 3 kHz to 300 GHz. In some embodiments, the RF transceiver 100 may be used for wireless communications, e.g., in a base station (BS) or a user equipment (UE) device of any suitable cellular wireless communications technology, such as Global System for Mobile Communication (GSM), Code Division Multiple Access (CDMA), or LTE. In a further example, the RF transceiver 100 may be used as, or in, e.g., a BS or a UE device of a millimeter-wave wireless technology such as 5G wireless (i.e., high-frequency/short-wavelength spectrum, e.g., with frequencies in the range between about 20 and 60 GHz, corresponding to wavelengths in the range between about 5 and 15 millimeters). In yet another example, the RF transceiver 100 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF transceiver 100 may be used for wireless communications using Bluetooth technology (e.g., a frequency band from about 2.4 to about 2.485 GHz, corresponding to a wavelength of about 12 cm). In other embodiments, the RF transceiver 100 may be used for transmitting and/or receiving RF signals for purposes other than communication, e.g., in an automotive radar system, or in medical applications such as magneto-resonance imaging (MRI).

Figure 2:
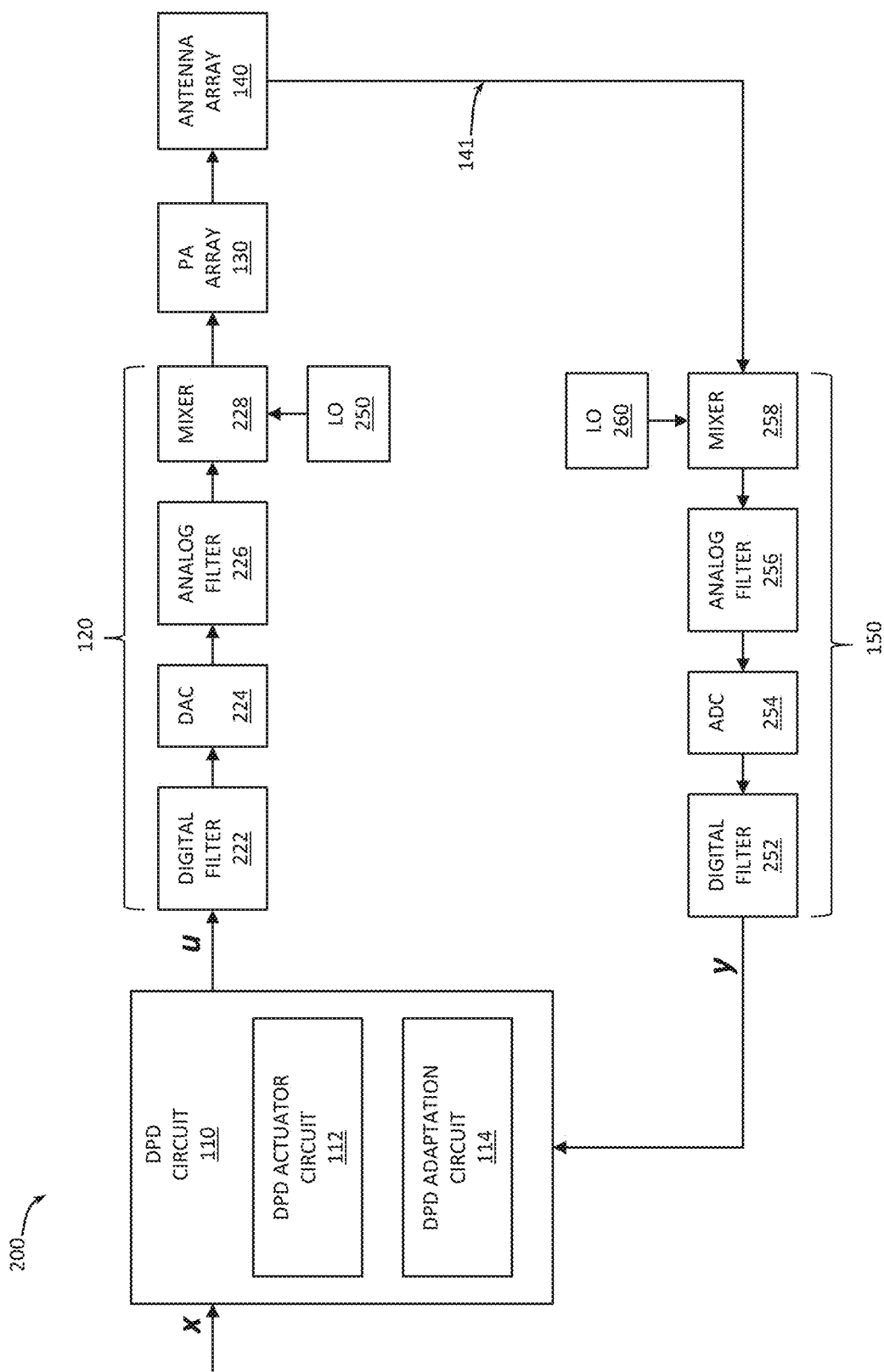
FIG. 2 provides a schematic block diagram of an RF transceiver similar to that shown in FIG. 1, further illustrating example implementations of transmitter and receiver circuits, according to some embodiments of the present disclosure.

FIG. 2 provides a schematic block diagram of an RF transceiver 200 similar to the RF transceiver 100 shown in FIG. 1, further illustrating example implementations of the transmitter circuit 120 and the receiver circuit 150, according to some embodiments of the present disclosure. The RF transceiver 200 shown in FIG. 2 is one example implementation of the RF transceiver 100 shown in FIG. 1, where the same reference numerals as described above refer to the same or analogous elements/components so that descriptions provided with respect to one of these figures are assumed to be applicable and do not have to be repeated for the other, and only the differences are described (the same is applicable to other drawings of the present disclosure).

As shown in FIG. 2, in some embodiments, the transmitter 120 may include a digital filter 222, a digital-to-analog converter (DAC) 224, an analog filter 226, and a mixer 228. In such a transmitter, the signal u may be filtered in the digital domain by the digital filter 222 to generate a filtered predistorted input, a digital signal. The output of the digital filter 322 may then be converted to an analog signal by the DAC 224. The analog signal generated by the DAC 224 may then be filtered by the analog filter 226. The output of the analog filter 226 may then be upconverted to RF by the mixer 228, which may receive a signal from a local oscillator 260 to translate the filtered analog signal from the analog filter 226 from baseband to RF. Other methods of implementing the transmitter 120 are also possible and within the scope of the present disclosure. For instance, in another implementation (not illustrated in the present drawings) the output of the digital filter 222 can be directly converted to an RF signal by the DAC 224. In such an implementation, the RF signal provided by the DAC 224 can then be filtered by the analog filter 226. Since the DAC 224 would directly synthesize the RF signal in this implementation, the mixer 228 and the local oscillator 260 illustrated in FIG. 2 can be omitted from the transmitter circuit 120 in such embodiments.

As further shown in FIG. 2, in some embodiments, the receiver 150 may include a digital filter 252, an analog-to-digital converter (ADC) 254, an analog filter 256, and a mixer 258. In such a receiver, the feedback signal 141 may be downconverted to the baseband by the mixer 148, which may receive a signal from a local oscillator 260 (which may be the same or different from the local oscillator 260) to translate the feedback signal 141 from the RF to the baseband. The output of the mixer 258 may then be filtered by the analog filter 256. The output of the analog filter 256 may then be converted to a digital signal by the ADC 254. The digital signal generated by the ADC 224 may then be filtered in the digital domain by the digital filter 252 to generate a filtered downconverted feedback signal y, which may be a sequence of digital values indicative of the output z of the PA array 130, and which may also be modeled as a vector. The feedback signal y may be provided to the DPD circuit 110. Other methods of implementing the receiver 150 are also possible and within the scope of the present disclosure. For instance, in another implementation (not illustrated in the present drawings) the RF feedback signal 141 can be directly converted to a baseband signal by the ADC 254. In such an implementation, the downconverted signal provided by the ADC 254 can then be filtered by the digital filter 252. Since the ADC 254 would directly synthesize the baseband signal in this implementation, the mixer 258 and the local oscillator 260 illustrated in FIG. 2 can be omitted from the receiver circuit 150 in such embodiments.

Further variations are possible to the RF transceiver 200 described above. For example, while upconversion and downconversion is described with respect to the baseband frequency, in other embodiments of the RF transceiver 200, an intermediate frequency (IF) may be used instead. IF may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the mixers of RF transmitter 120 or the receiver 150 may include several such stages of IF conversion. In another example, although a single path mixer is shown in each of the transmit (TX) path (i.e., the signal path for the signal to be processed by the transmitter 120) and the receive (RX) path (i.e., the signal path for the signal to be processed by the receiver 150) of the RF transceiver 200, in some embodiments, the TX path mixer 228 and the RX path mixer 258 may be implemented as a quadrature upconverter and downconverter, respectively, in which case each of them would include a first mixer and a second mixer. For example, for the RX path mixer 258, the first RX path mixer may be configured for performing downconversion to generate an in-phase (I) downconverted RX signal by mixing the feedback signal 141 and an in-phase component of the local oscillator signal provided by the local oscillator 260. The second RX path mixer may be configured for performing downconversion to generate a quadrature (Q) downconverted RX signal by mixing the feedback signal 141 and a quadrature component of the local oscillator signal provided by the local oscillator 260 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

Example Beamforming Arrangement

In various embodiments, DPD using coding for phased antenna arrays may be implemented with beamforming performed in the analog domain, in the digital domain, or with hybrid beamforming. An example of beamforming performed in the analog domain is shown in FIG. 3, providing a schematic block diagram illustrating beamforming using an RF transceiver 300 with a phased antenna array 340, according to some embodiments of the present disclosure.

Figure 3:
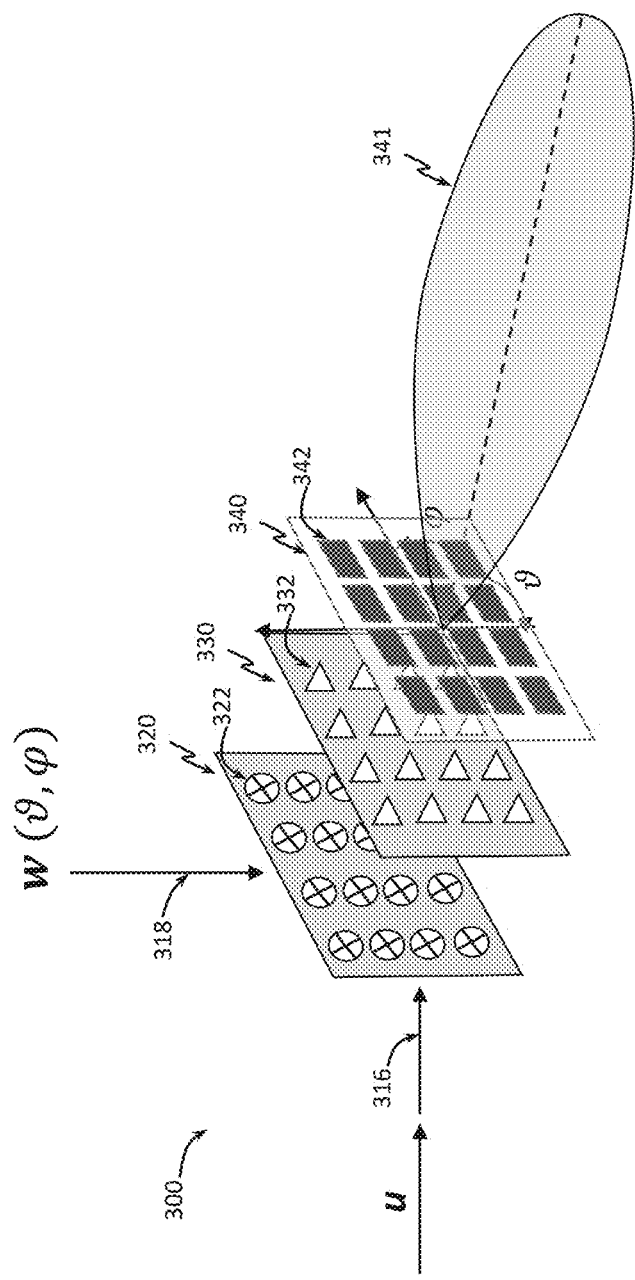
FIG. 3 provides a schematic block diagram illustrating beamforming using an RF transceiver with a phased antenna array, according to some embodiments of the present disclosure.

FIG. 3 illustrates a part of the RF transceiver 300, in particular a TX path that includes a beamformer array 320, a PA array 330, and an antenna array 340. The PA array 330 may be an example of the PA array 130 and/or the antenna array 340 may be an example of the antenna array 140. The RF transceiver 300 may further include other components, such as the ones described with reference to FIGS. 1 and 2.

In general, the antenna array 340 may include N (e.g., N=16) antenna elements 342 (only one of which is labeled with a reference numeral in FIG. 3 in order to not clutter the drawing). In various embodiments, the antenna elements 342 may include dipoles, open-ended waveguides, slotted waveguides, micro-strip antennas, and the like. In some embodiments, the antenna elements 342 may include any suitable elements configured to wirelessly transmit and/or receive RF signals. Although FIG. 3 illustrates a certain number of antenna elements 342, it is appreciated that various embodiments may be implemented with an array of any number of two or more antenna elements. Furthermore, it is understood that the embodiments disclosed herein may be implemented with different types of antenna arrays, such as time-domain beamformers, frequency-domain beamformers, and the like.

Similarly, the beamformer array 320 may include a plurality of (e.g., N) beamformer taps 322 (only one of which is labeled with a reference numeral in FIG. 3 in order to not clutter the drawing). The beamformer array 320 may be configured to receive an input 318, indicative of weights w to be applied by the different beamformer taps 322 to perform the desired beamforming to generate a beam 341. When the beamformer array 320 includes N beamformer taps 322, the input w may be a vector of N complex gain values, one corresponding to a different one of the beamformer taps 322. Each of the beamformer taps 322 may have at least two inputs and one output. One of the two inputs of a given beamformer tap 322 may include a TX signal 316, based on the signal u, described above, i.e., an input signal of a lower frequency, e.g., the TX signal at IF. The other one of the two inputs of a given beamformer tap 322 may include a weight value of the input w to be applied by the tap. In some embodiments, the weight values of the input w may include phase shift values (e.g., the input w may include information indicative of angles θ and φ, which refer to, respectively, elevation and azimuth that the TX beam 341 is steered to, as shown in FIG. 3). The one output of each of the beamformer taps 322 of the array 320 is an output to a corresponding PA 332 of the PA array 330. Similar to the antenna array 340 and the TX beamformer array 320, the PA array 330 may include a plurality of (e.g., N=16) PAs 332 (only one of which is labeled with a reference numeral in FIG. 3 in order to not clutter the drawing). The beamformer tap 322 may be configured to mix (e.g., multiply) the input signal 316 with the beamformer tap or weight of the input signal 318. For example, given the angles provided in the input 318, the beamformer taps are calculated, as is well known to those skilled in the art. The beamformer taps 322 may be complex gain multipliers, where the input signal 316 is multiplied by the complex gain weight so that the RF output is a scaled, phase rotated version of the RF input (e.g., input signal u). By carefully controlling the gain and/or phase of signals radiated by different antenna elements 322, radiation patterns of different antenna elements may constructively interfere in a desired direction, creating a main beam 341 in that direction, while interfering destructively in several other directions other than the direction of the main beam 341.

In some embodiments, each of the arrays 320, 330, and 340 may include the same number of elements (as is illustrated in FIG. 3 with each array showing 16 elements), so that there is one-to-one correspondence between the components from each of the TX beamformer array 320, the PA array 330, and the antenna array 340. In such embodiments, a given beamformer tap 322 is associated with one of the PAs 332, and that PA 332 is associated with one of the antenna elements 342. However, in other embodiments, there may be one-to-many or many-to-one correspondence between various elements of the arrays shown in FIG. 3.

Example Coded DPD Arrangements

Figure 17:
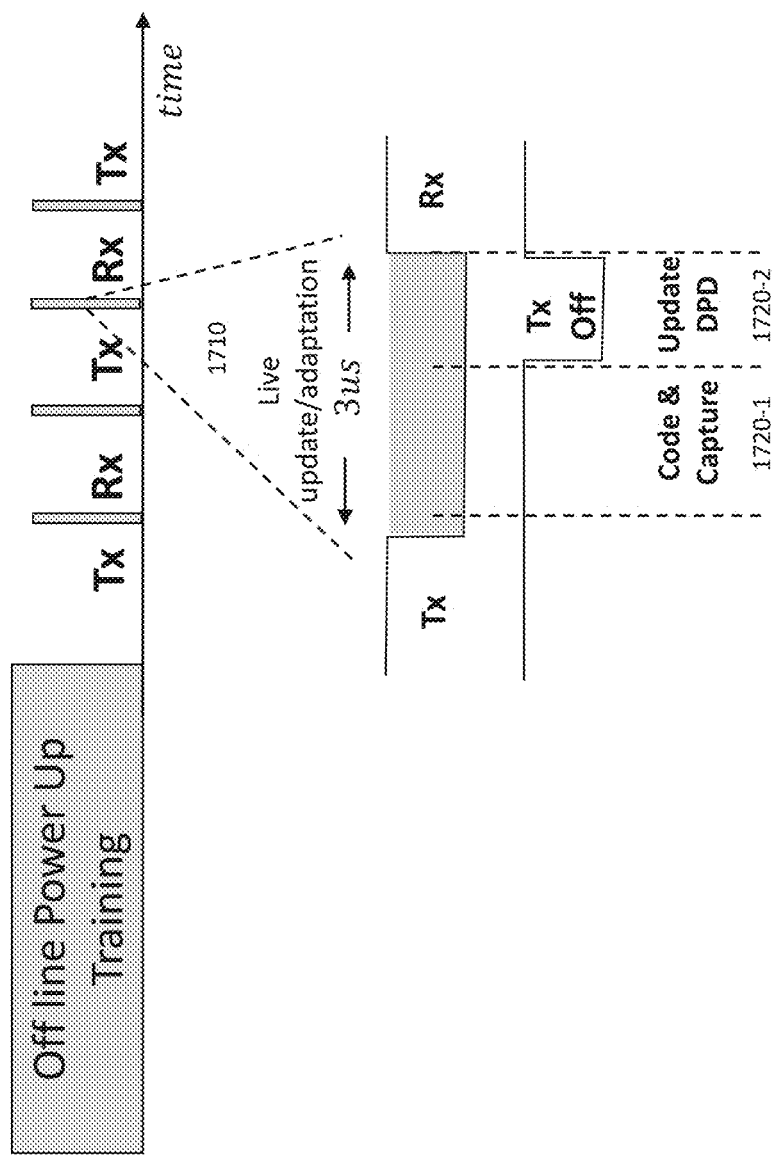
FIG. 17 provides an example illustration of transmitting codes during transmit-to-receive transition when performing DPD using coding, according to some embodiments of the present disclosure.
Figure 18:
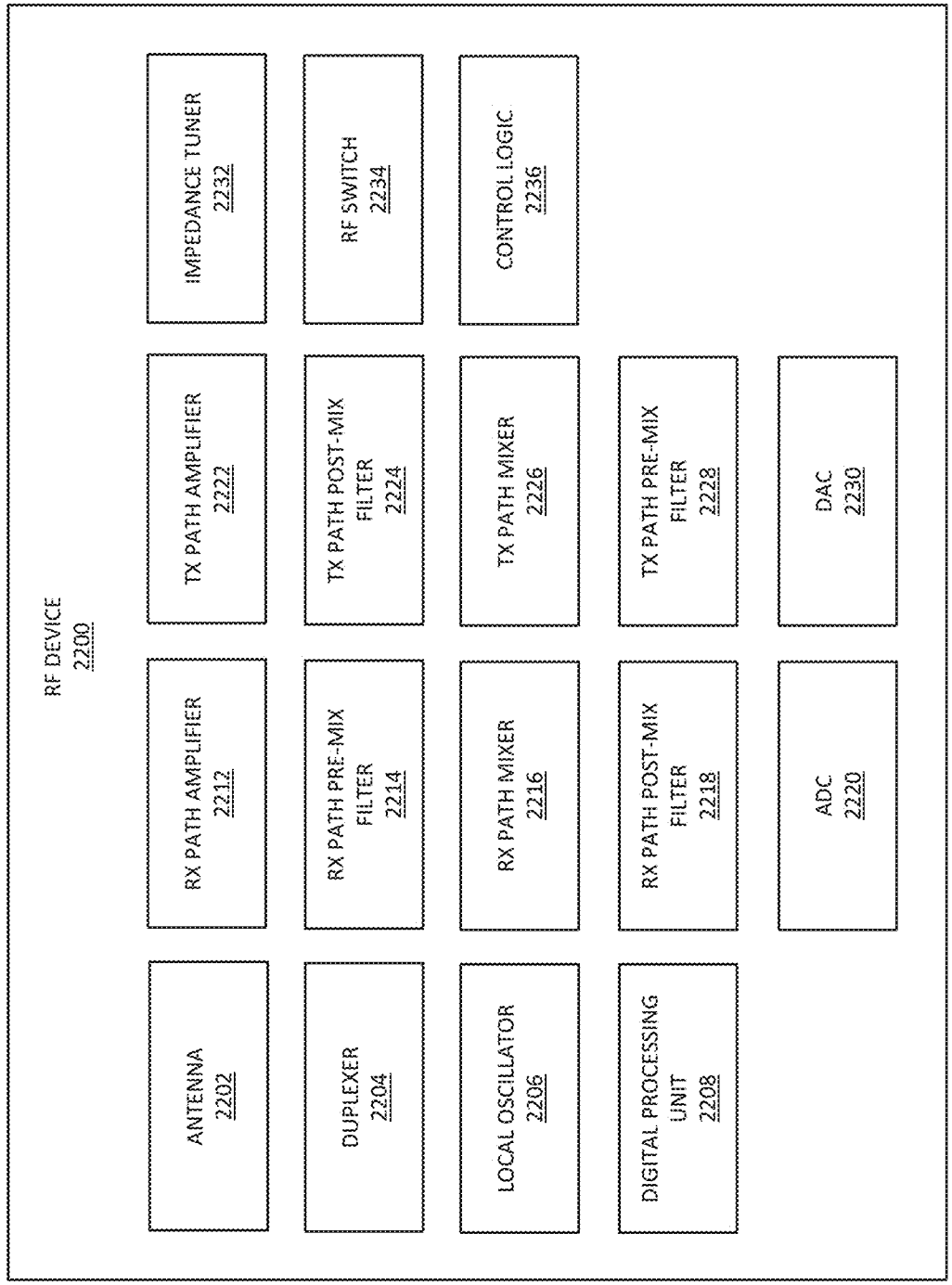
FIG. 18 provides a schematic block diagram illustrating an RF system in which DPD using coding may be implemented, according to some embodiments of the present disclosure.

FIGS. 4-17 illustrate various aspects of coded DPD arrangements that may be implemented in any of the RF devices described herein, e.g., in the RF transceivers shown in FIGS. 1-3 and/or in the RF device 2200 shown in FIG. 18. In general, a coded DPD arrangement may include a DPD actuator circuit (e.g., the DPD actuator circuit 112), a DPD adaptation circuit (e.g., the DPD adaptation circuit 114), and a coded beamformer circuit (e.g., the beamformer array 320 in combination with an encoding circuit 420). Some examples of such coded DPD arrangements are illustrated in the RF transceivers shown in FIG. 4 and FIGS. 10-15.

Figure 4:
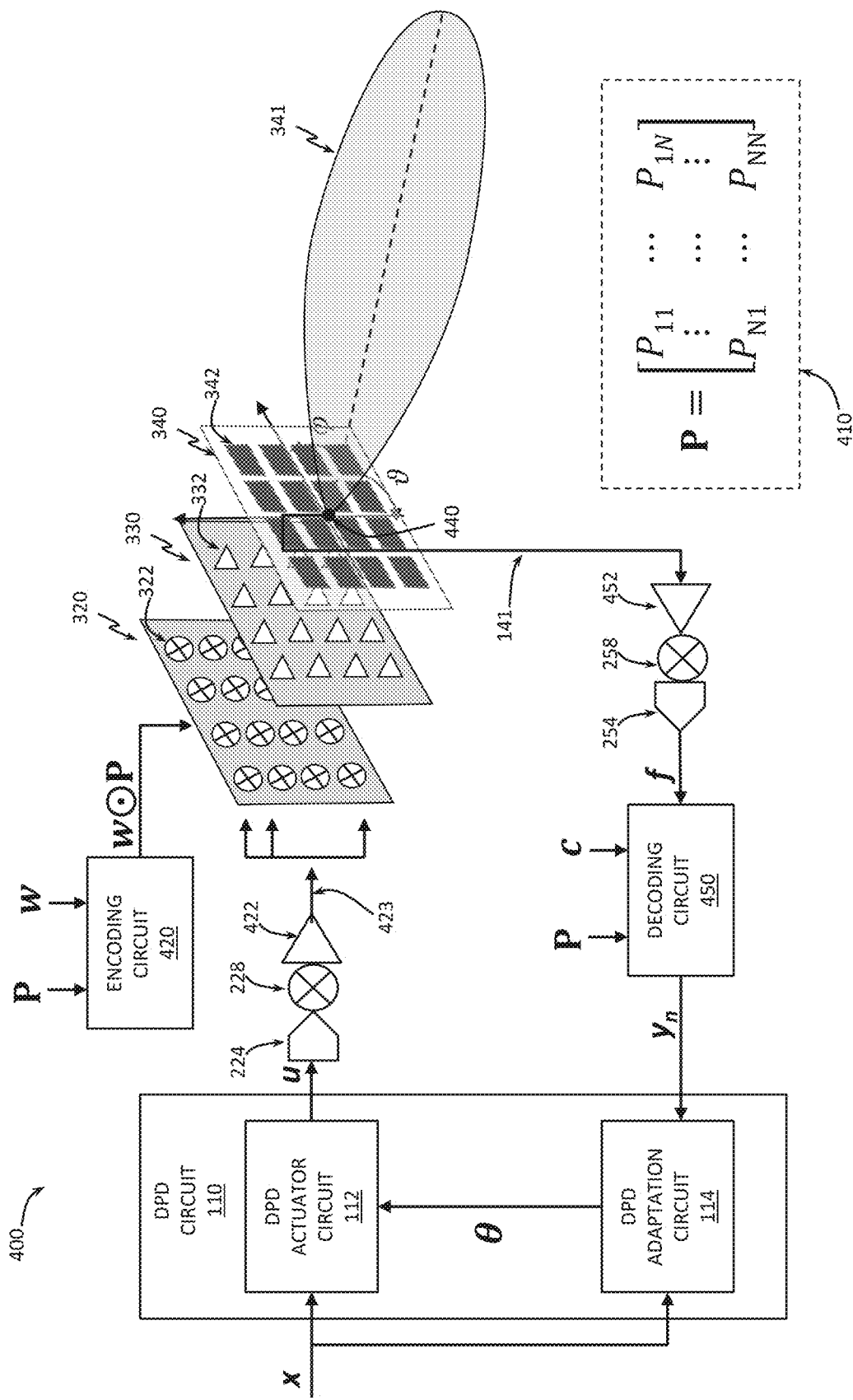
FIG. 4 provides a schematic block diagram illustrating an RF transceiver similar to that shown in FIG. 3, further configured to perform DPD using coding, according to some embodiments of the present disclosure.

FIG. 4 provides a schematic block diagram illustrating an RF transceiver 400, similar to the RF transceiver 300 and further configured to perform DPD using coding, according to some embodiments of the present disclosure. The RF transceiver 400, shown in FIG. 4, is one example implementation of the RF transceiver 200, shown in FIG. 2, that uses the beamforming arrangement as shown for the RF transceiver 300 of FIG. 3, where the same reference numerals as described above refer to the same or analogous elements/components so that descriptions provided with respect to one of these figures are assumed to be applicable and do not have to be repeated for the other, and only the differences are described.

As shown in FIG. 4, the RF transceiver 400 may include the DPD circuit 110, as described above, configured to provide a predistorted signal u to a sequence of the DAC 224, the mixer 228, and, optionally, a pre-amplifier 422, to generate an analog signal 423, which is an analog version of an upconverted and, optionally, pre-amplified predistorted signal u. The analog signal 423 may then be provided to each of the taps 322 the beamformer array 320. The values applied by the taps 322 may be set by an encoding circuit 420 as described below.

The encoding circuit 420 may be used to realize coding applied to the input signals provided to the PAs 332 so that contributions from different PAs 332 may be differentiated in the feedback signal 141. To that end, the encoding circuit 420 may be configured to receive a vector w of weights to be applied to the input signal to the PAs 332 to perform the desired beamforming, and further configured to receive a matrix P containing a plurality of N codes to be applied to the input signals for the PAs 332. The vector w may include N weights, designated as $w_1$, $w_2$, and so on until $w_N$, each of which corresponding to a different PA 332. Each of the N codes is a vector having N elements. The N codes are arranged as N rows or N columns of the square (N×N) matrix P, as is shown in FIG. 4 with an inset 410 showing the elements of the matrix P. For example, code 1 may be a vector of N elements of the first column of the matrix P, i.e., elements $P_{11}$ through $P_{N1}$, code 2 may be a vector of N elements of the second column of the matrix P, i.e., elements $P_{12}$ through $P_{N2}$, and so on until code N that may be a vector of N elements of the Nth column of the matrix P, i.e., elements $P_{1N}$ through $P_{NN}$. The encoding circuit 420 may be configured to perform point-by-point combination (e.g., multiplication), denoted by the sign "⊙", of the individual weights of the weight vector w and the values of the elements of the matrix P, as shown in FIG. 4 with the encoding circuit 420 providing an input of w⊙P to the beamformer array 320, to set the values of the taps 322. The N codes are to be applied sequentially, i.e., one after the other, possibly, with some time period between the codes when no code is applied, and, a given element of a given code corresponding to, in general, a complex gain to be applied to a different one of the N PAs 332 when that code is applied. For example, when the encoding circuit 420 applies code 1, then the first tap 322-1 is set to a value that is based on $w_1$ and $P_{11}$ (e.g., $w_1*P_{11}$), the second tap 322-2 is set to a value that is based on $w_2$ and $P_{21}$ (e.g., $w_2*P_{21}$), and so on until the Nth tap 322-N that is set to a value that is based on $w_{N1}$ and $P_{N1}$ (e.g., $w_N*P_{N1}$). The taps 322 modify the signal 423 provided to each of the taps 322, so that different PAs 332 then receive respective modified input signals from the corresponding taps 322. When, at a later point in time after applying code 1, the encoding circuit 420 applies code 2, then the first tap 322-1 is set to a value that is based on $w_1$ and $P_{12}$ (e.g., $w_1*P_{12}$), the second tap 322-2 is set to a value that is based on $w_2$ and $P_{22}$ (e.g., $w_2*P_{22}$), and so on until the Nth tap 322-N that is set to a value that is based on $w_N$ and $P_{N2}$ (e.g., $w_N*P_{N2}$). This proceeds until the encoding circuit 420 applies code N, where the first tap 322-1 is set to a value that is based on $w_1$ and $P_{1N}$ (e.g., $w_1*P_{1N}$), the second tap 322-2 is set to a value that is based on $w_2$ and $P_{2N}$ (e.g., $w_2*P_{2N}$), and so on until the Nth tap 322-N that is set to a value that is based on $w_N$ and $P_{NN}$ (e.g., $w_N*P_{NN}$). It should be noted that the values of the weights $w_1, \ldots w_N$ may change over the time that the N codes are applied, so the value of, e.g., the weigh $w_1$ applied by the first tap 322-1 when code 1 is applied may not be the same as the value of the weigh $w_1$ applied by the first tap 322-1 when code N is applied, as is known to be applied to perform beamforming.

As further shown in FIG. 4, the RF transceiver 400 may further include a probe antenna element 440, schematically illustrated in FIG. 4 as a black dot. In some embodiments, the probe antenna element 440 may be an additional antenna element (e.g., a calibration probe, i.e., an additional antenna element used for calibration of the antenna array 340) that may be provided in the vicinity of (e.g., on a single substrate with) the N antenna elements 342 of the antenna array 340. In other embodiments, the probe antenna element 440 may be one of the N antenna elements 342 of the antenna array 340. In some embodiments, the probe antenna element 440 may be configured to perform one or more of near-field measurements, surface-wave coupling measurements, or substrate coupling measurements of the wireless signals transmitted by at least the subset of the N antenna elements 342 when the coded beamformer circuit (e.g., the encoding circuit 420 in combination with the beamformer array 320) sequentially applies the N codes. In other embodiments, although not specifically illustrated in the present drawings, the probe antenna element 440 may be a far-field probe.

The probe antenna element 440 is configured to receive the wireless signals transmitted by at least a subset (i.e., less than all of) the antenna elements 342, and provide the feedback signal 141, indicative of the received wireless signals, to the receiver circuit 150. For example, the feedback signal 141 may be provided to a sequence of a low-noise amplifier 452, the mixer 258, and the ADC 254. A signal f, which is a digital version of the feedback signal 141 and may, therefore, be referred to as a "digital feedback signal f," may then be provided from the ADC 254 to a decoding circuit 450.

The digital feedback signal f contains contributions from the different ones of the PAs 332, but all combined into a single signal. The decoding circuit 450 is then configured to apply the matrix P of N codes to the digital feedback signal f to separate the digital feedback signal f into N digital signals $y_n$, where n is an integer between 1 and N, each of which corresponds to a digital feedback signal indicative of a contribution to the feedback signal 141 from a respective different PA 332. Thus, even though the arrow labeled with "$y_n$" is shown as a single arrow, it represents N signals $y_1, y_2, \ldots, y_N$.

FIG. 4 further illustrates that, in some embodiments, the decoding circuit 450 may further be configured to apply a vector c of coupling coefficients $c_n$, where n is an integer between 1 and N. Each coupling coefficient $c_n$ is a complex scalar number corresponding to a different one of the N PAs 332 in that the coefficient is indicative of a portion of the wireless signal, transmitted by one of the antenna elements 342 associated with that PA 332, that is coupled to the output 141 of the probe antenna element 440. For example, a coupling coefficient $c_1$ is indicative of a portion of the wireless signal transmitted by a first antenna element 342-1 that is coupled to (i.e., a contribution from which is included in) the feedback signal 141 (because the first antenna element 342-1 is associated with a first PA 332-1, the coupling coefficient $c_1$ corresponds to the first PA 332-1, which, in turn, corresponds to the first beamformer tap 322-1). Similarly, a coupling coefficient $c_2$ is indicative of a portion of the wireless signal transmitted by a second antenna element 342-2 that is coupled to (i.e., a contribution from which is included in) the feedback signal 141 (because the second antenna element 342-2 is associated with a second PA 332-2, the coupling coefficient $c_2$ corresponds to the second PA 332-2, which, in turn, corresponds to the second beamformer tap 322-2), and so on until a coupling coefficient $c_N$ that is indicative of a portion of the wireless signal transmitted by an Nth antenna element 342-N that is coupled to (i.e., a contribution from which is included in) the feedback signal 141 (because the Nth antenna element 342-N is associated with an Nth PA 332-N, the coupling coefficient $c_N$ corresponds to the Nth PA 332-N, which, in turn, corresponds to the Nth beamformer tap 322-N). As will be described in greater detail below, in some embodiments, the decoding circuit 450 may be configured to separate the feedback signal f into N individual feedback signals $y_n$ without using the coupling coefficients c.

Although the decoding circuit 450 is shown in FIG. 4 as separate from the DPD adaptation circuit 114, this is only done so in order to schematically illustrate that individual digital feedback signals $y_n$ are used by the DPD adaptation circuit 114 to update the DPD coefficients θ applied by the DPD actuator circuit 112. In some embodiments, the decoding circuit 450 may be a part of the DPD adaptation circuit 114. By distinguishing feedback signals $y_n$ indicative of the pathways of individual PAs 332 using the matrix P, the DPD adaptation circuit 114 may be configured to perform adaptation of the DPD coefficients in a manner that results in reduced nonlinearity of the PA array 330. In some embodiments, the DPD adaptation circuit 114 may be configured to perform adaptation of the DPD coefficients for each of the PA 332 individually, i.e., each PA 332 would then be associated with an own DPD model with corresponding DPD coefficients. In other embodiments, the DPD adaptation circuit 114 may be configured to perform adaptation of the DPD coefficients for groups of the PA 332 (where at least one group may include more than one PA 332), i.e., each group of the PAs 332 would then be associated with an own DPD model with corresponding DPD coefficients. Such embodiments may be advantageous to individualize DPD models based on different characteristics of different PAs. In one example, PAs of different types may be grouped in different groups (e.g., Doherty PAs belonging to one group, class A-B PAs belonging to another group, etc.). In another example, PAs based on different semiconductor materials may be grouped in different groups (e.g., SiGe PAs belonging to one group, GaN PAs belonging to another group, etc.). In yet another example, PAs manufactured using different technologies may be grouped in different groups (e.g., CMOS PAs belonging to one group, bipolar junction transistor PAs belonging to another group, etc.). In such embodiments, decoding may also be performed on a per-group basis, where individual digital feedback signals $y_n$ may be one feedback signal per group of PAs 332, in which case there may be less than N individual digital feedback signals $y_n$.

In various embodiments, the N codes may be either orthogonal or non-orthogonal. The N codes may be referred to as "orthogonal" when $\|P^H*P-I\|=0$, where the double lines "$\|$" mean that a 2-norm is taken, $P^H$ is a Hermitian transpose of the matrix P, and I is the identity matrix of dimensions N×N. It should be noted that the 2-norm is the most common norm, but there are many other norms that may be used to determine whether the N codes are orthogonal or non-orthogonal. For example, the N codes may be defined as orthogonal when the 1-norm of the matrix P is equal to zero, when the infinity-norm of the matrix P is equal to zero, or when, in general, a p-norm of the matrix P is equal to zero.

Figures 6A, 6B:
FIGS. 6A and 6B provide example illustrations of complex gain values used for, respectively, orthogonal and non-orthogonal coding, according to some embodiments of the present disclosure.

FIGS. 5A and 5B provide example illustrations of, respectively, an orthogonal and a non-orthogonal matrix P, according to some embodiments of the present disclosure. In particular, FIG. 5A illustrates an example of Hadamard codes, which is one example of orthogonal coding, that may be used for a 4×4 array of PAs 332 (i.e., each code includes 16 values, and different codes are arranged as, e.g., different columns of the 16×16 matrix P shown in FIG. 5A). FIG. 5B illustrates one specific example of a non-orthogonal matrix P where various angles ψ may be associated with different PAs 332 to realize non-orthogonal coding, where at least some of the angles ψ may be different from 0° or 180° (on the other hand, Hadamard matrix may also be presented in a form similar to that shown in FIG. 5B, but ψ=0° to realize the value of 1 of the elements shown in FIG. 5A, and ψ=180° to realize the value of −1 of the elements shown in FIG. 5A). This is schematically illustrated in FIGS. 6A and 6B, providing example illustrations of complex gain values used for, respectively, orthogonal and non-orthogonal coding, according to some embodiments of the present disclosure. FIG. 6A illustrates that, for the Hadamard codes, a phase shift ψ applied by a given code element is either 0° or 180°, while for the non-orthogonal codes, a phase shift ψ applied by a given code element may be somewhere in between 0° or 180°, at least for some of the elements of the N codes. For example, taking a Hadamard matrix and replacing all values of −1 with a value of $e^{j\psi}$ where ψ is greater than 0° and less than 180°, while keeping all values of 1 as $e^{j\psi}$ where ψ is equal to 0° would result in a non-orthogonal matrix of codes. It should be noted while FIG. 6B illustrates N codes that only vary the phase shifts ψ, while the amplitude remains 1 for all codes, in general, one or more of an amplitude A and a phase shift ψ may be modified in order to realize orthogonal or non-orthogonal coding using N codes.

Figure 7A:
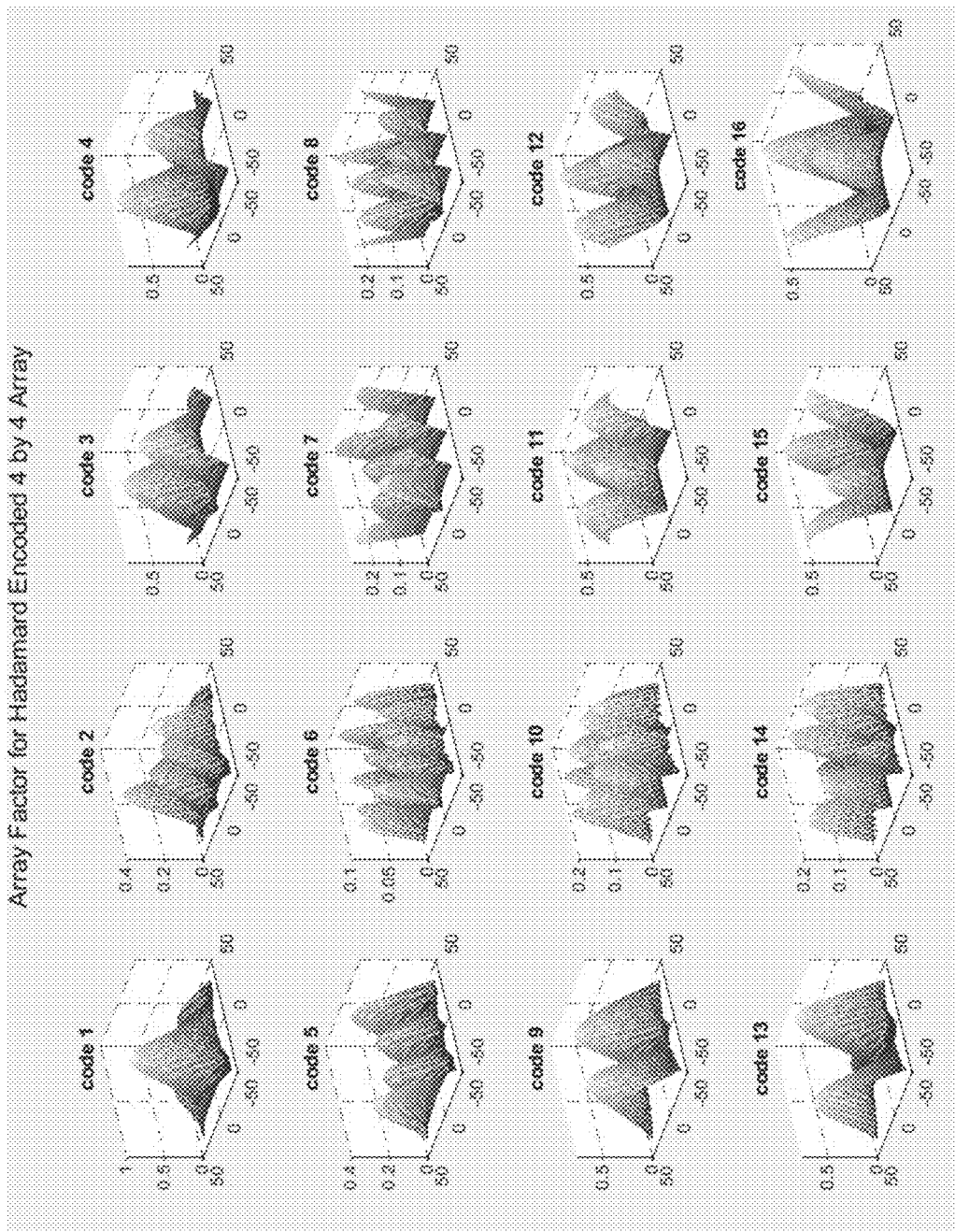
FIGS. 7A and 7B provide example illustrations of the effects of, respectively, orthogonal and non-orthogonal codes on beam patterns of the beams wirelessly transmitted by an RF transceiver.
Figure 7B:
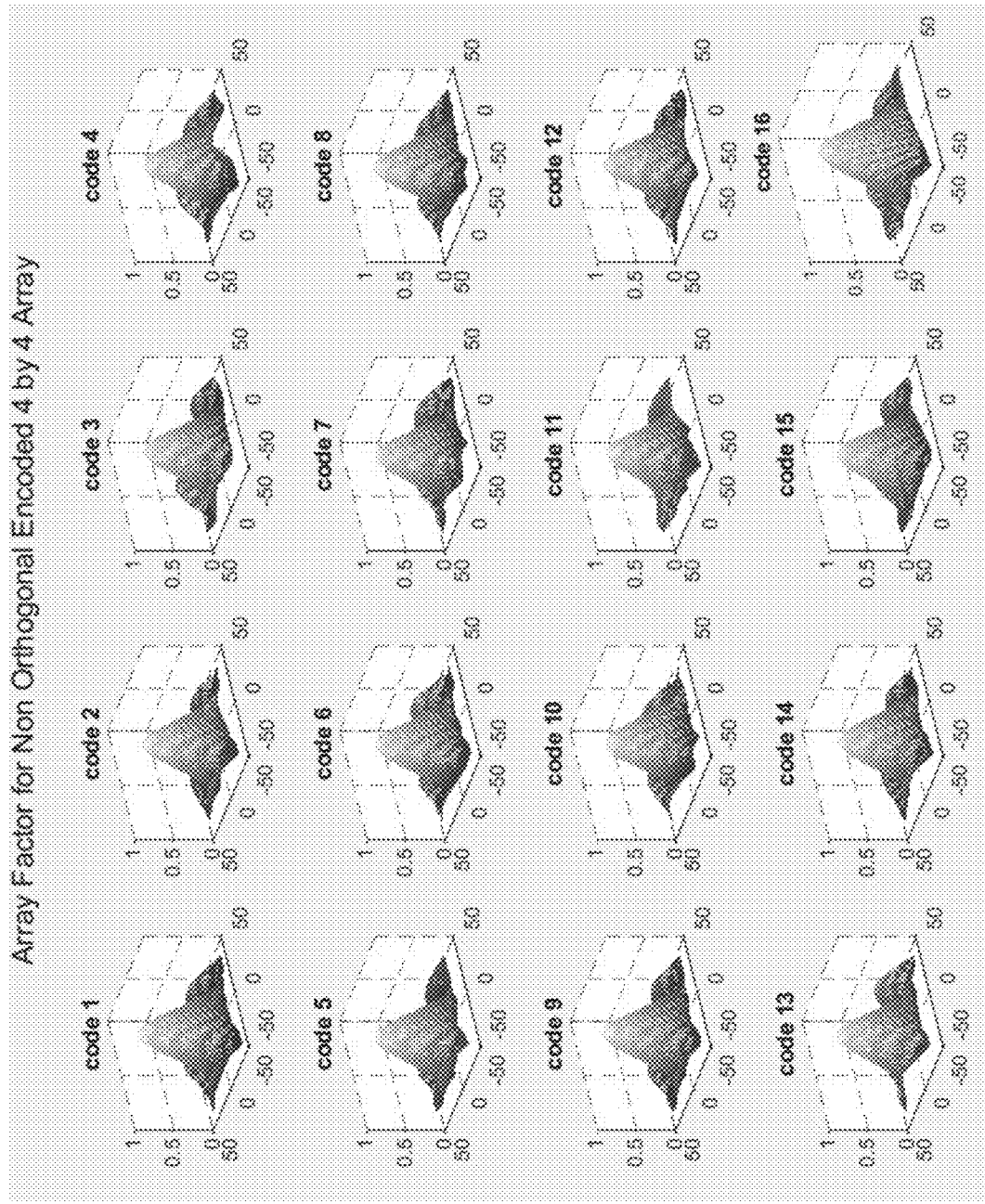

In some deployment scenarios, orthogonal codes may be not suitable because they may significantly distort the beam patterns. FIG. 7A provides example illustrations of the effects of 16 orthogonal codes (i.e., N=16) on beam patterns of the beams wirelessly transmitted by an RF transceiver with 16 PAs 332. If code 1 is assumed to be the code with the desired beam pattern (i.e., the beam pattern as set by the weights w), then, as can be seen in FIG. 7A, some other codes, e.g., code 6, code 12, or code 16, are significantly different from that beam pattern. One metric of whether a beam meets the specifications of the target beam pattern is maximum array factor gain error, measured in decibel (dB), indicative of the size of the side lobes in the beam with a code applied relative to the side lobes with no code applied. Codes such as code 6, code 12, or code 16 shown in FIG. 7A are likely to not meet the side lobe specifications if the beam of code 1 has the target beam pattern. Unless other precautions are taken (some of which are described below), such codes may not be suitable or acceptable for live transmission. That is why non-orthogonal codes may be preferred in some deployment scenarios, such as live transmission. FIG. 7B provides example illustrations of the effects of 16 non-orthogonal codes (i.e., N=16) with ψ=+45° on beam patterns of the beams wirelessly transmitted by an RF transceiver with 16 PAs 332. If code 1 of FIG. 7B is assumed to be the code with the desired beam pattern, then, as can be seen in FIG. 7B, the beam patterns of all other codes still remain substantially the same (in sharp contrast to those shown in FIG. 7A). In various embodiments, the encoding can be a number of different quasi-orthogonal coding techniques such as Walsh-Hadamard codes, Hamming codes, etc.

It should be noted that during the coding process the linearity of the transmitted signal may be compromised in the sense that the power in the central lobe can be reduced, thereby compromising the ability of the receiver to detect the original signal and hence manifesting as an effective degrading in EVM and BER. Similarly, with power in the central lobe reduced due to coding, the ACLR may be effectively compromised.

Figure 8A:
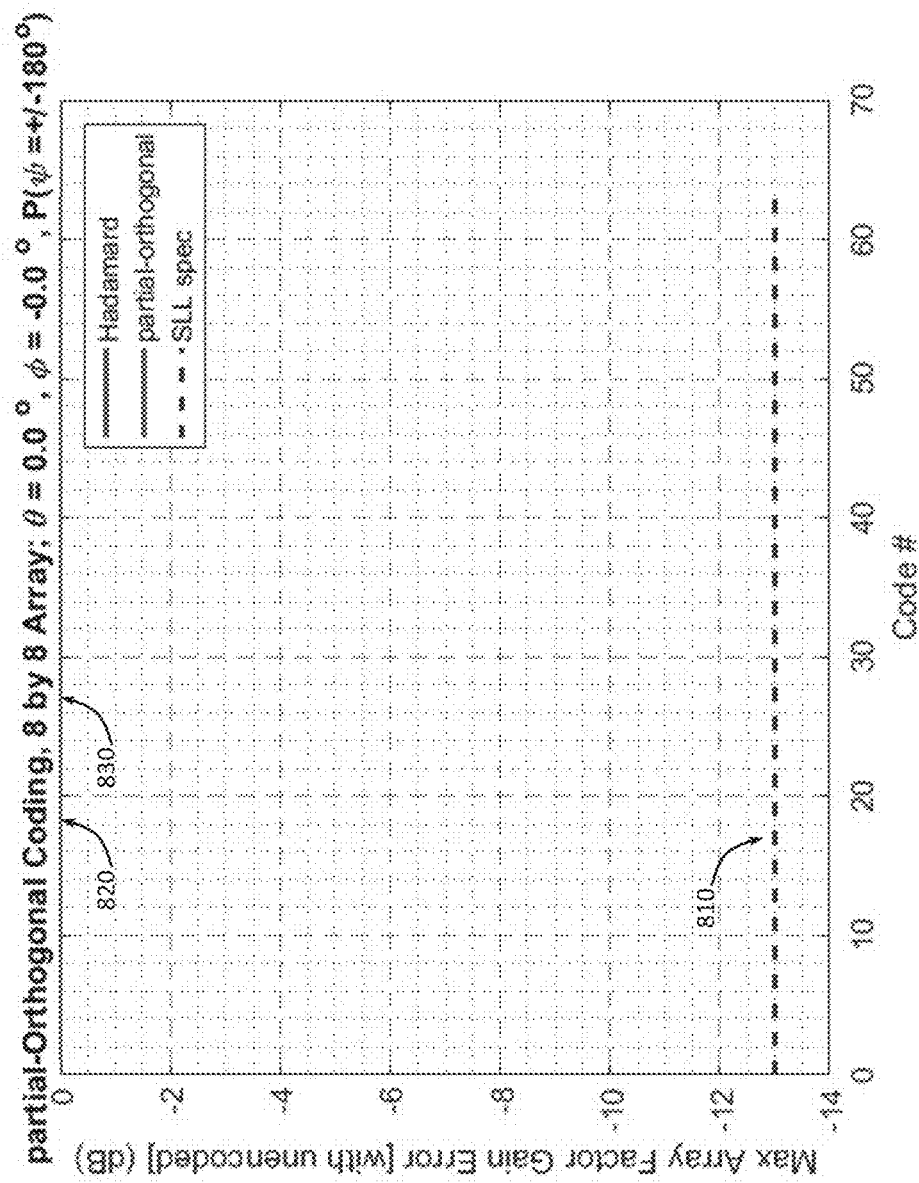
FIGS. 8A-8F provide example illustrations of a maximum array factor gain error as a function of a code, according to some embodiments of the present disclosure.
Figure 8B:
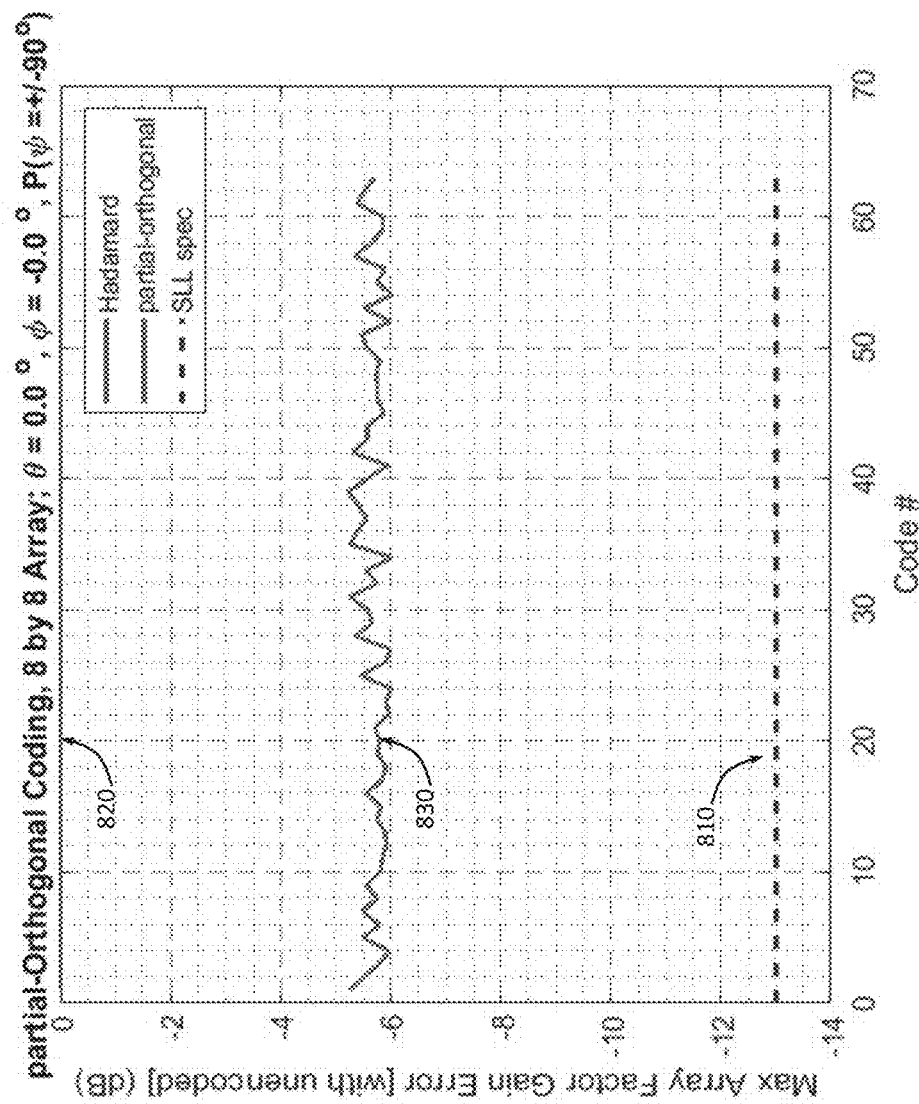
Figure 8C:
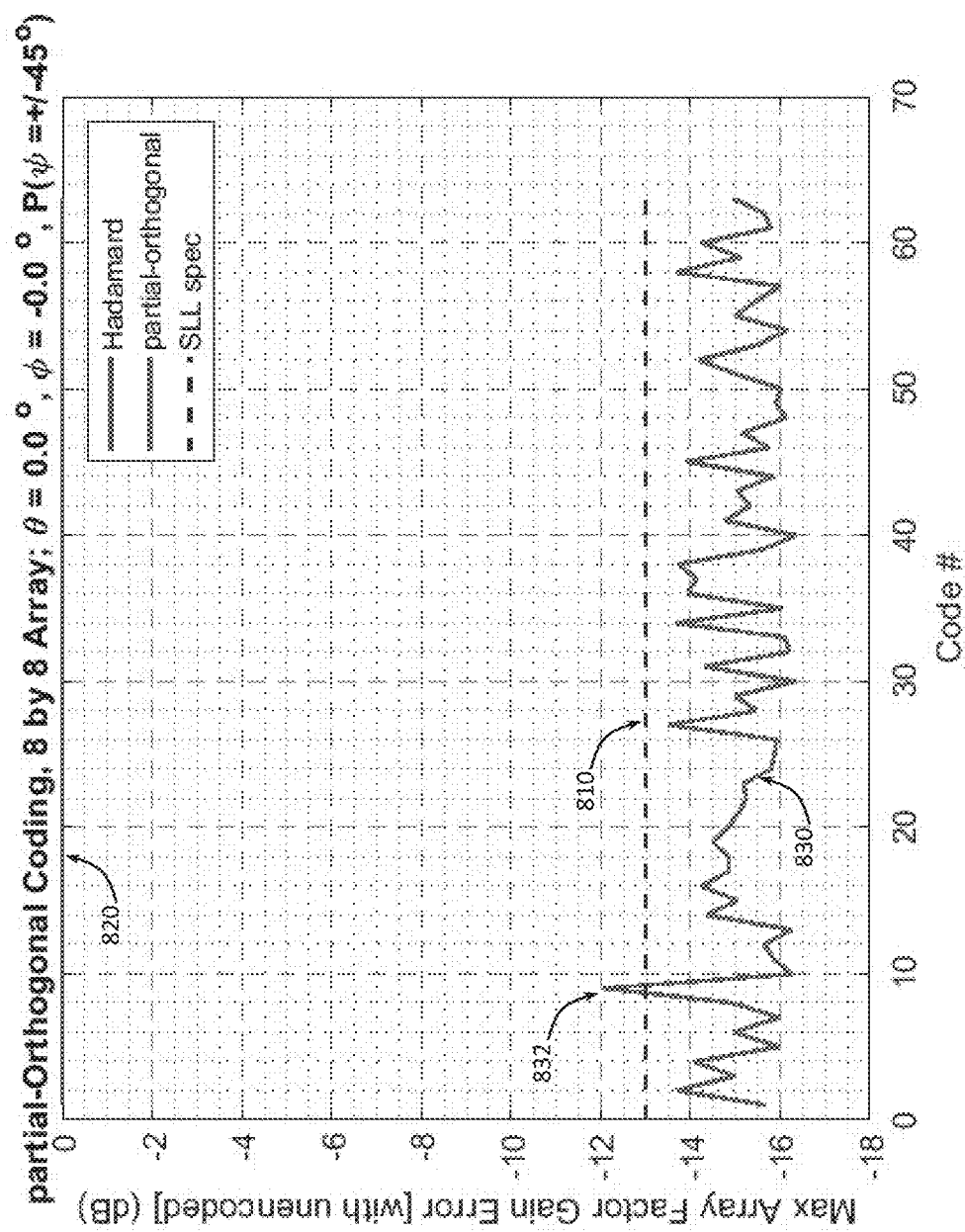
Figure 8D:
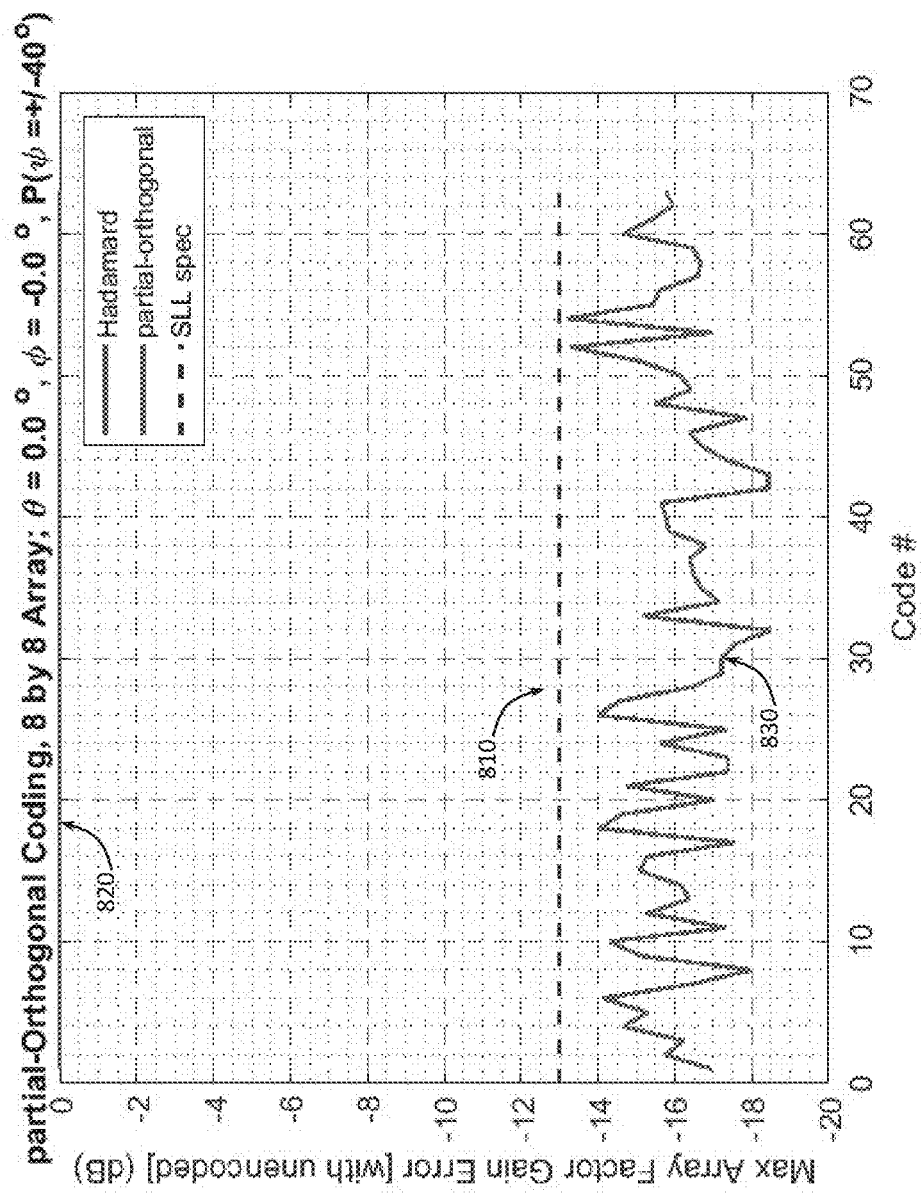
Figure 8E:
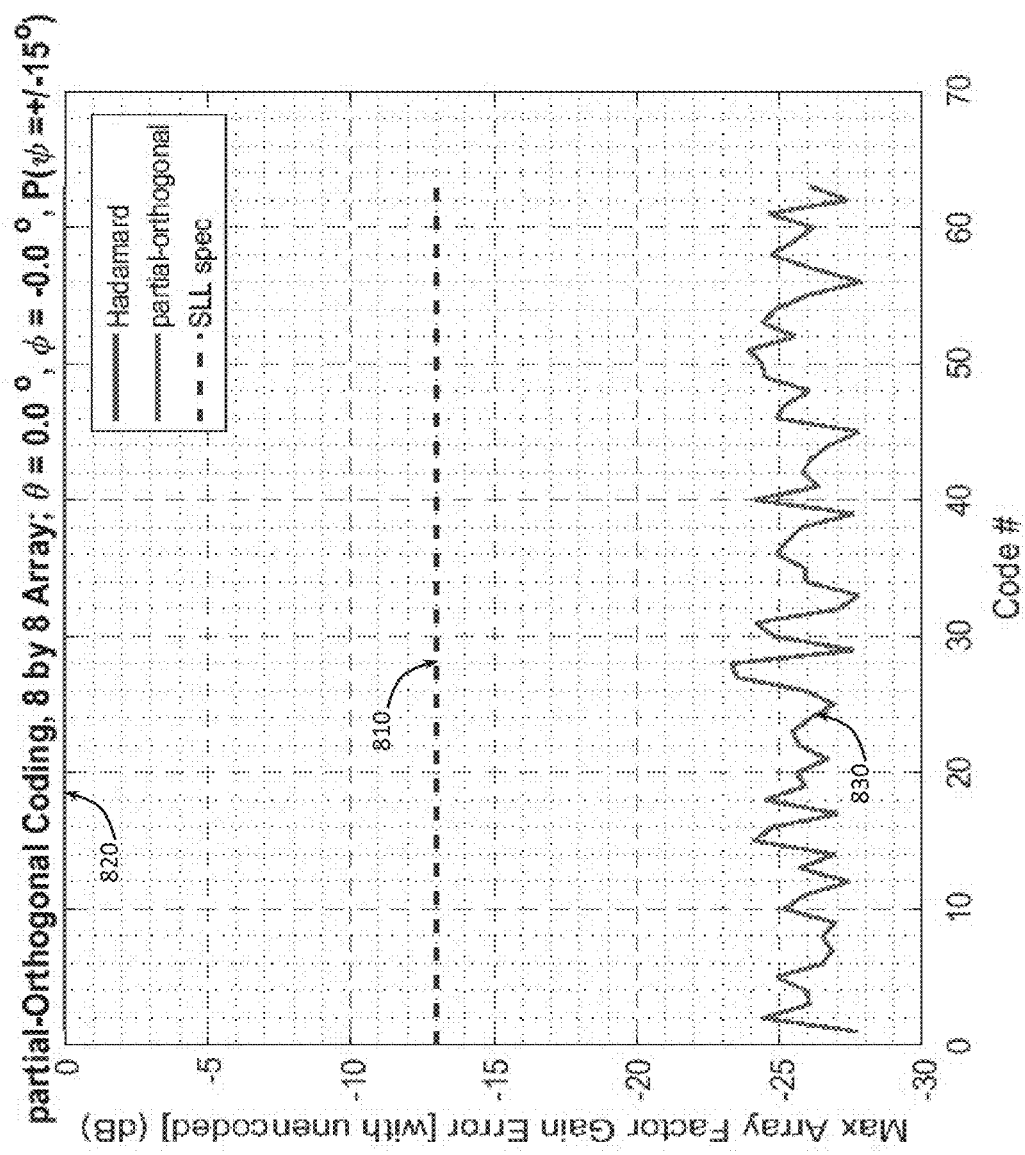
Figure 8F:
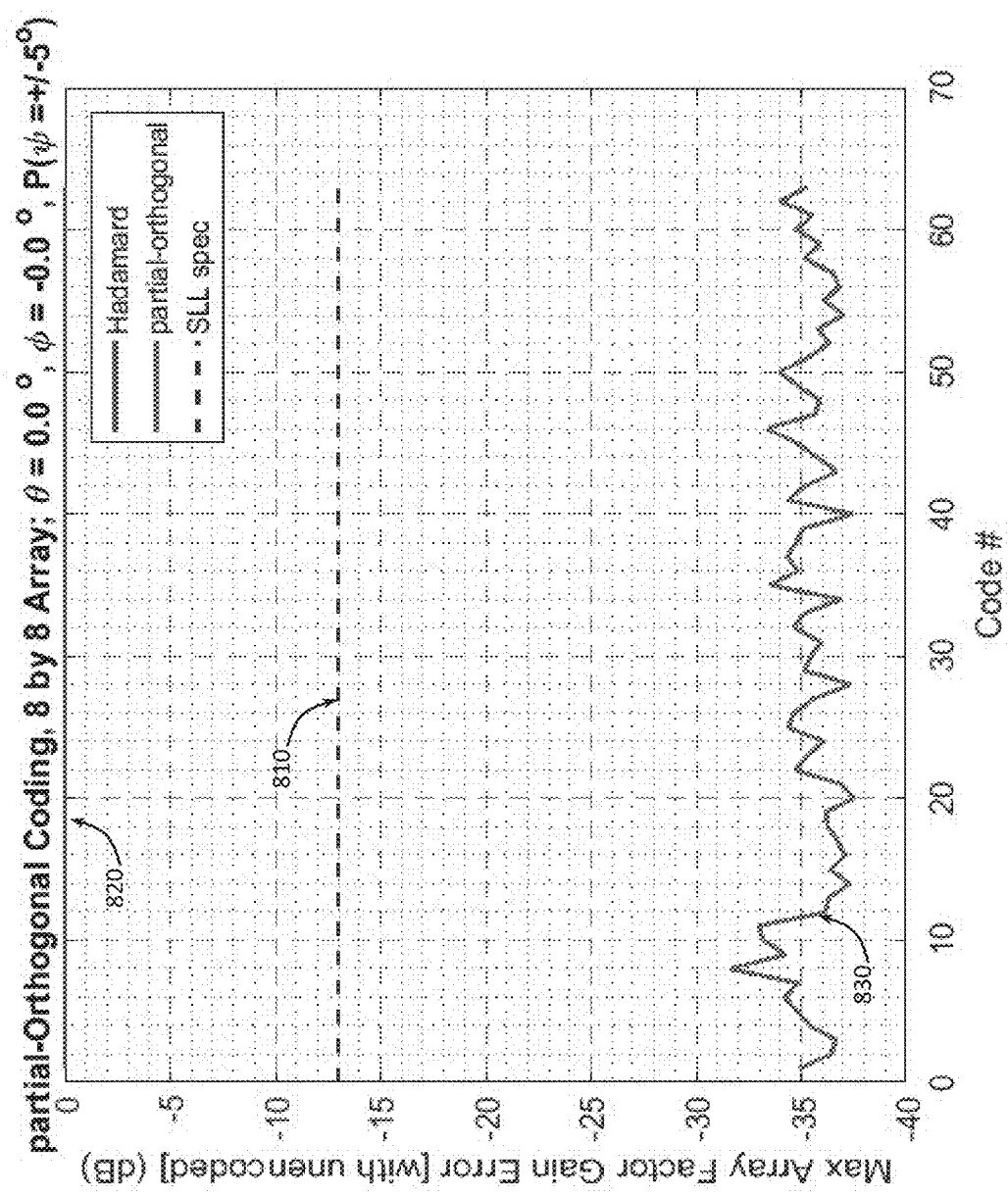

Some phase shifts ψ applied by a given code element of non-orthogonal codes may also result in codes that do not meet the side lobe specifications of the target beam and, therefore, have to be chosen carefully. Some considerations for the choice of angles ψ for non-orthogonal codes are described with reference to FIGS. 8A-8F, providing example illustrations of a maximum array factor gain error as a function of a code for a set of 64 codes (i.e., N=64), according to some embodiments of the present disclosure. Each of FIGS. 8A-8F shows a function 810, illustrating the side lobe leakage (SLL) specification, a function 820, illustrating a maximum array factor gain error as a function of codes for a set of 64 Hadamard codes, and a function 830, illustrating a maximum array factor gain error as a function of codes for a set of 64 non-orthogonal codes. The functions 810 and 820 are the same in each of FIGS. 8A-8F, whereas the function 830 is different, depending on the angle ψ. As shown in FIGS. 8A-8F, the function 820 is significantly above the SLL specification provided by the function 810, which means that Hadamard codes would not be acceptable because they do not satisfy the SLL specification. FIG. 8A illustrates that when ψ=+/−180°, then the function 830 coincides with the function 820 and, therefore, also does not satisfy the SLL specification provided by the function 810. FIG. 8B illustrates that when ψ=+/−90°, then the function 830 is better in terms of the maximum array factor gain error than the function 830 for the scenario of FIG. 8A, but still does not satisfy the SLL specification provided by the function 810. FIG. 8C illustrates that when ψ=+/−45°, then the function 830 is better in terms of the maximum array factor gain error than the function 830 for the scenario of FIG. 8B, but still does not satisfy the SLL specification provided by the function 810 because one of the codes (namely, code 9 for the example shown) has a peak 832 that is beyond the SLL specification provided by the function 810. FIG. 8D illustrates that when ψ=+/−40°, then the function 830 is better in terms of the maximum array factor gain error than the function 830 for the scenario of FIG. 8C and does satisfy the SLL specification provided by the function 810 because all of the codes are below the function 810, but does not provide any margin for error. FIG. 8E illustrates that when ψ=+/−15°, then the function 830 is better in terms of the maximum array factor gain error than the function 830 for the scenario of FIG. 8D and does satisfy the SLL specification provided by the function 810 with an acceptable margin for error. FIG. 8F illustrates that when ψ=+/−5°, then margin for error for the function 830 is advantageously increased even further, compared to the function 830 for the scenario of FIG. 8E. FIGS. 8A-8F illustrate, that in some embodiments, it may be advantageous that, for at least one element of the N codes, the complex gain of the element is configured to adjust a phase of a corresponding one of the PA input signals by an angle having an absolute value greater than 0 degrees and less than about 45 degrees, e.g., less than about 40 degrees.

While non-orthogonal codes may be selected so that they impose less disturbance on the target beam pattern, processing of such codes at the receiver side may impose higher requirements on the receiver. In particular, the more the orthogonality is reduced (which may, e.g., be quantified in terms of how far $\|P^H*P-I\|$ is from zero), the better the signal-to-noise ratio (SNR) of the receiver needs to be. In other words, when DPD is done with codes which are non-orthogonal, there may be less processing gain and immunity to noise than with orthogonal codes. That is why in some deployment scenarios it may still be beneficial to employ orthogonal codes where some other measures may be taken to reduce the impact of the distortion of the beam pattern (e.g., duty cycling of code transmissions, as described with reference to FIG. 16).

Figure 9:
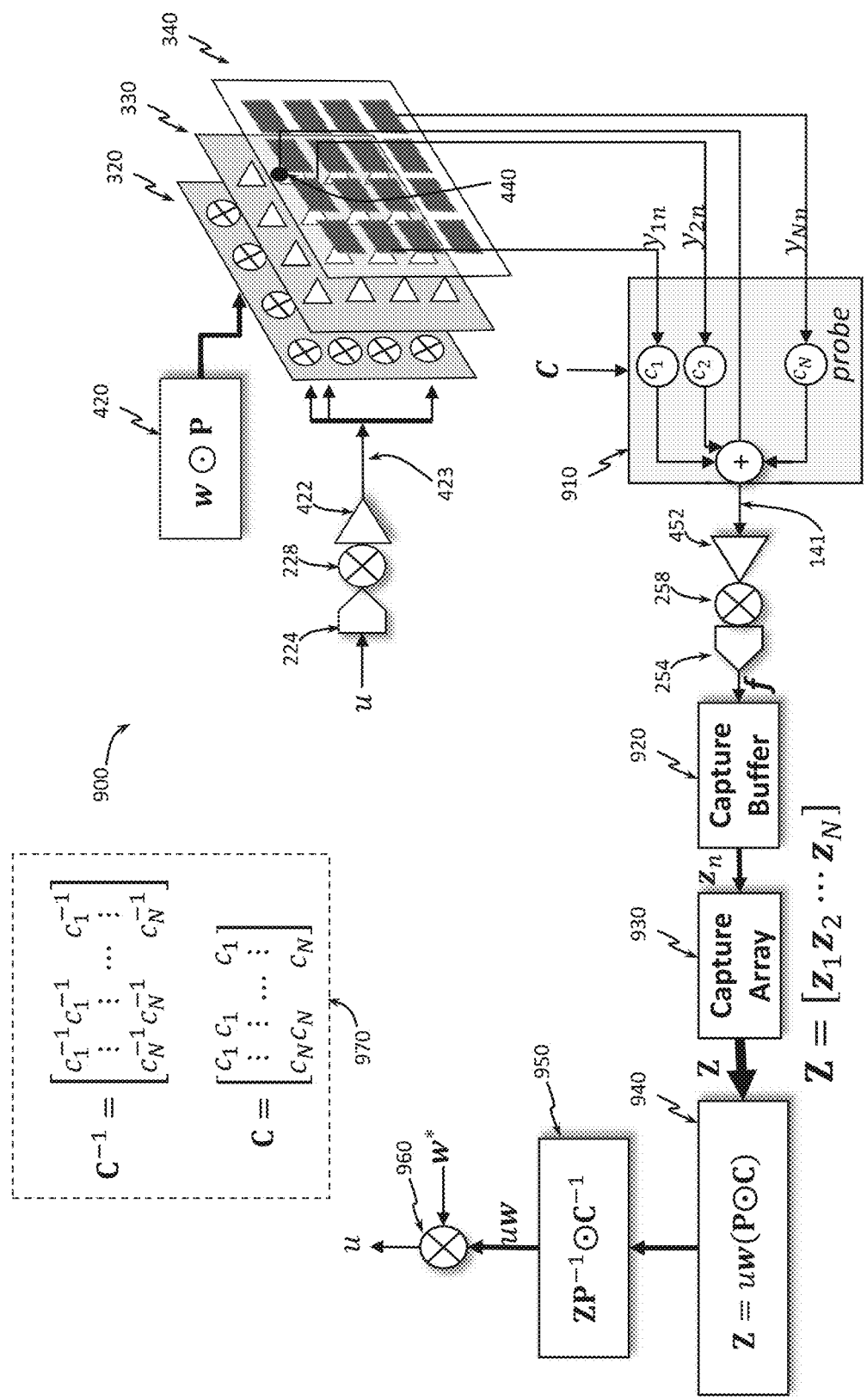
FIG. 9 provides a schematic block diagram illustrating an RF transceiver similar to that shown in FIG. 4, further configured to use coupling coefficients and a capture array to perform DPD using coding, according to some embodiments of the present disclosure.

FIG. 9 provides a schematic block diagram illustrating an RF transceiver 900 similar to that shown in FIG. 4, further configured to use coupling coefficients and a capture array to perform DPD using coding, according to some embodiments of the present disclosure. In particular, FIG. 9 illustrates how the matrix P and the coupling coefficients C may be used in a system of equations to obtain the predistorted signal u. To that end, FIG. 9 illustrates a probe 910, which is a mathematical representation of the wireless signal detected by the probe antenna element 440. As shown in FIG. 9, the probe 910 may be modeled as a plurality of individual responses (i.e., wireless transmissions) from the individual antenna elements 342, labeled as y1n, y2n, and so on, until yNn, where n represent the coding phase (step, state), n=1, 2, . . . , N.

To clarify the notation of y1n, y2n, and so on, until yNn, there are N elements producing 1 to N responses and, likewise, there are N coding phases from code 1 to code N. For each coding phase there are N responses. Thus, there are in total N by N total responses from y11 for element 1, code 1; y12 for element 1 code 2; and so on, until yNN for element N code N. Thus, in FIG. 9, yin represents response of element 1 for the nth code (code n); y2n represents response of element 2 for the nth code; and so on, until yNn represents response of element N for the nth code.

As shown in FIG. 9, each individual response is multiplied by a corresponding coupling coefficient c1, c2, and so on until cN, and the results of the multiplications are then added to produce the feedback signal 141. Once the feedback signal 141 has been converted to the digital feedback signal f, a capture buffer 920 captures digital representations $z_n$ of the wireless responses of the individual antenna elements 342, where n is an integer between 1 and N, and each $z_n$ is a vector of D elements, where D is the depth of the capture buffer, e.g., about 10000 samples. Together, the vectors $z_n$ for all values of n form a capture array 930 Z. A block 940 illustrates how the captured values of the array Z are related to the matrix P, a matrix of the coupling coefficients C, and the beamformer weights w. Namely, Z=uw (P⊙C). The matrix P is known because the encoding applied by the encoding circuit 420 is known, the beamformer weights w are known, and the matrix C of the coupling coefficients may be estimated (where an example of the matrix C and its inverse are shown in FIG. 9 within an inset 970). By performing operation $ZP^{-1} \odot C^{-1}$, shown in a block 950, uw may be determined. By applying w*, a complex conjugate of the weights w, to uw, in a block 960, u may be extracted for each of the PAs (PAs) separately. By comparing the extracted response to the transmitted input the necessary information required to train the DPD, indicative of how the DPD coefficients need to be updated, can be determined.

Figure 10:
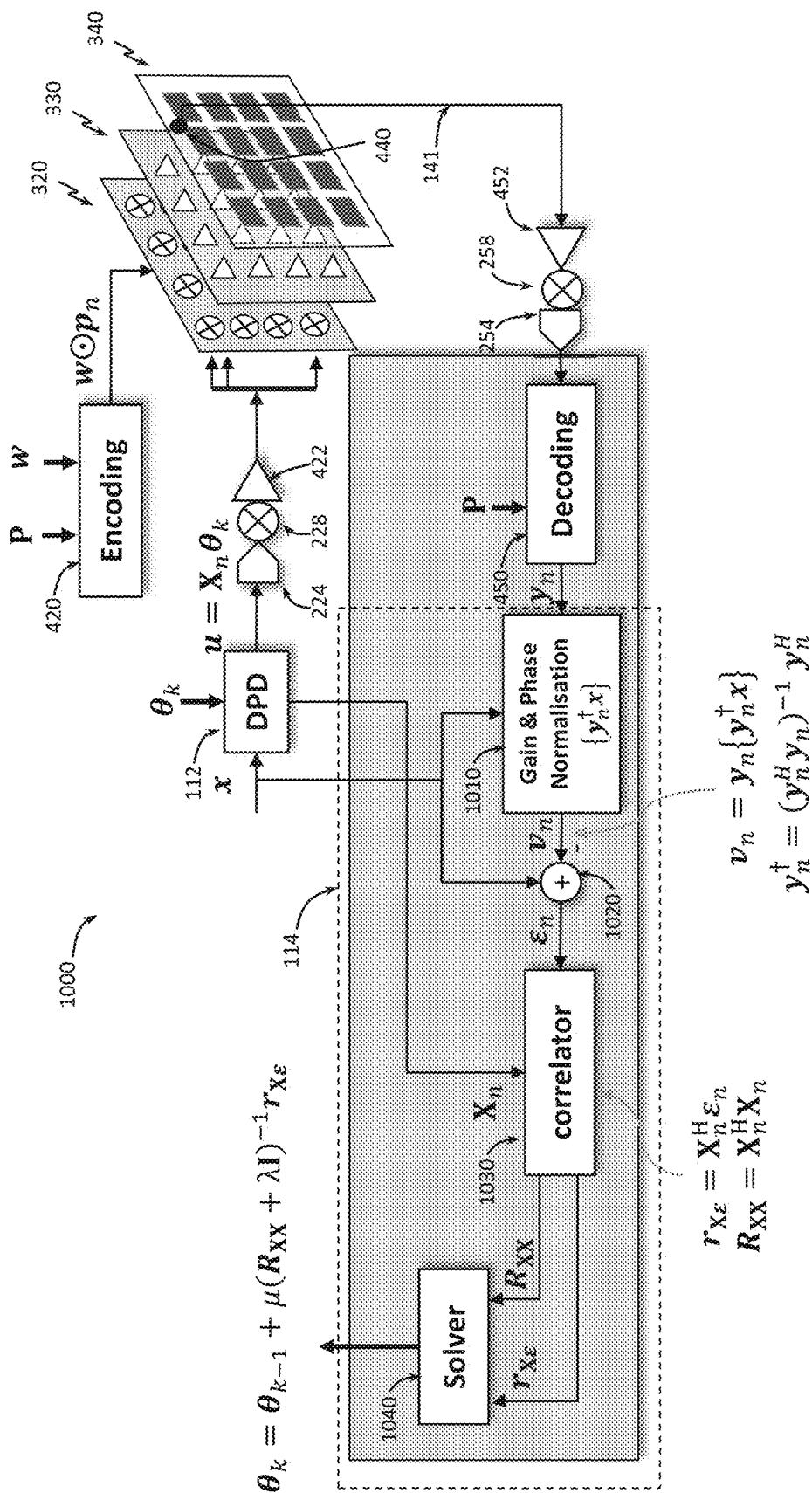
FIG. 10 provides a schematic block diagram illustrating an RF transceiver similar to that shown in FIG. 4, further configured to perform recursive adaptation in DPD using coding, according to some embodiments of the present disclosure.

FIG. 10 provides a schematic block diagram illustrating an RF transceiver 1000 similar to that shown in FIG. 4, further configured to perform recursive adaptation in DPD using coding, according to some embodiments of the present disclosure. The RF transceiver 1000 illustrates generation of the individual digital feedback signals $y_n$, which may be done as was described above with reference to FIG. 4, to obtain $y_1, y_2, \ldots y_N$, each of which may be a decoded column vector of complex values captured on a corresponding decoding phase.

A gain and phase normalization circuit 1010 may be configured to perform gain normalization and phase rotation of $y_n$ with respect to the input signal (vector) x to produce normalized feedback signals (column vectors) $v_n$ (again, n is an integer between 1 and N) so that, for each normalized feedback signal $v_n$, a sum of squares between the normalized feedback signal $v_n$ and the input signal x to the DPD actuator 112 may be reduced or minimized. The DPD coefficients θ may then be updated based on the N normalized feedback signals $v_n$. In some embodiments, the normalization of the circuit 1010 may include performing gain and phase adjustment/rotation of the N feedback signals ($y_n$) by a scalar complex gain $\hat{g}_n$, where $v_n = \hat{g}_n y_n$ and the gain is chosen such that the following sum of squares error is minimized, $$\hat{g}_n = \min_{\hat{g}_n} \|x - \hat{g}_n y_n\|.$$

in some embodiments, the normalization of the circuit 1010 may be configured to compute the pseudoinverse of $y_n$ as $$y_n^\dagger = (y_n^H y_n)^{-1} y_n^H.$$

Not specifically shown in FIG. 10 is the time alignment of these 2 vectors, i.e., the time alignment x and $v_n$, which omitted in the present drawings for clarity because it is a standard practice that is well understood by those skilled in the art. Using the gain and phase normalization may eliminate the need to know the coupling coefficients in the decoding and hence the need to estimate the coupling coefficients C.

An error generation circuit 1020 may be configured to generate an error signal $\varepsilon_n$ (again, n is an integer between 1 and N, and each $\varepsilon_n$ may be a column vector) based on a difference between the input signal x and the normalized feedback signal $v_n$, for N normalized feedback signals $v_n$. For example, in some embodiments, $\varepsilon_n = x - v_n$. The error signal $\varepsilon_n$ may be referred to as a "training error for the nth element". Again, each of x, $y_n$, $v_n$, and $\varepsilon_n$ may be a vector of D elements, where D is the depth of the capture buffer, e.g., about 10000 samples, and there are N vectors for each of x, $y_n$, $v_n$, and $\varepsilon_n$, each vector corresponding to a different coding state and hence different PA 332.

A correlator circuit 1030 may be configured to generate an auto-correlation matrix $R_{XX}$ and a cross-correlation vector $r_{X\varepsilon}$. In some embodiments, the auto-correlation matrix $R_{XX}$ may be a result of auto-correlation between the DPD features (aka basis), as is well known to those skilled in the art, e.g., as $$R_{XX} = X_n^H X_n,$$

is the auto-correlation evaluated during the nth coding state and thereby represents the auto-correlation for the nth PA. Similarly, the cross-correlation vector $r_{X\varepsilon}$ between the features and the error vector may be generated, e.g., as $$r_{X\varepsilon} = X_n^H \varepsilon_n,$$

where $X_n$ is a feature matrix during nth encoding phase of N encoding phases.

A solver 1040 may then be configured to update the DPD coefficients (also sometimes referred as "DPD taps" or "DPD parameters") based on the auto-correlation matrix $R_{XX}$ and the cross-correlation vector $r_{X\varepsilon}$. In some embodiments, the solver 1040 may update the DPD coefficients using, e.g., the damped, regularized Gauss-Newton (recursive) equation: $\theta_k = \theta_{k-1} + \mu(R_{XX} + \lambda I)^{-1} r_{X\varepsilon}$, where is the previous tap estimate, $\theta_k$ is the updated DPD coefficient estimate, $\mu$ is a positive scalar that may be used to trade-off noise smoothing with speed of convergence, and $\lambda$ is a positive scalar regularization factor that may be used to trade-off estimation variance for bias. The Gauss-Newton is one of very may recursive algorithms that could be employed, and, in other embodiments, the solver 1040 may be configured to update the DPD coefficients based on the auto-correlation matrix $R_{XX}$ and the cross-correlation vector $r_{X\varepsilon}$ using any other recursive algorithms.

The operations performed by the decoding circuit 450, the gain and phase normalization circuit 1010, the error generation circuit 1020, the correlator circuit 1030, and the solver 1040 may be repeated for each code of the N codes (i.e., for each of the N encoding phases), applied sequentially by the encoding circuit 420. For example, the order of operations for each of the N codes could be: apply code; transmit the TX vector; capture probe response; decode; perform gain normalization, phase rotate; time align; generate error; generate auto- and cross-correlation and update DPD taps. Thus, the DPD algorithm may be updated N times (i.e., the DPD coefficients may be updated N times), once per coding cycle. As illustrated in FIG. 10 with a dashed box labeled with "114," the gain and phase normalization circuit 1010, the error generation circuit 1020, the correlator circuit 1030, and the solver 1040 may be considered to be a part of the DPD adaptation circuit 114, configured to output the updated DPD coefficient estimate $\theta_k$. The updated DPD coefficient estimate $\theta_k$ is then used by the DPD actuator circuit 112 to apply predistortion to the input signal x to generate the predistorted signal u as, e.g., $u = X_n \theta_k$, as also illustrated in FIG. 10.

The DPD learning (adaptative, training, tuning) algorithm described with reference to FIG. 10 is based on a so-called "Direct Learning Algorithm." In other embodiments, the RF transceiver 1000 may be configured to perform DPD learning based on a so-called "Indirect Learning Algorithm," both of which approached are well understood by those skilled in the art. What is in stark difference to the approaches known in the art, is exploiting the inherent recursive update nature of the algorithm while cycling through the N codes and updating the DPD algorithm once per code.

Figure 11:
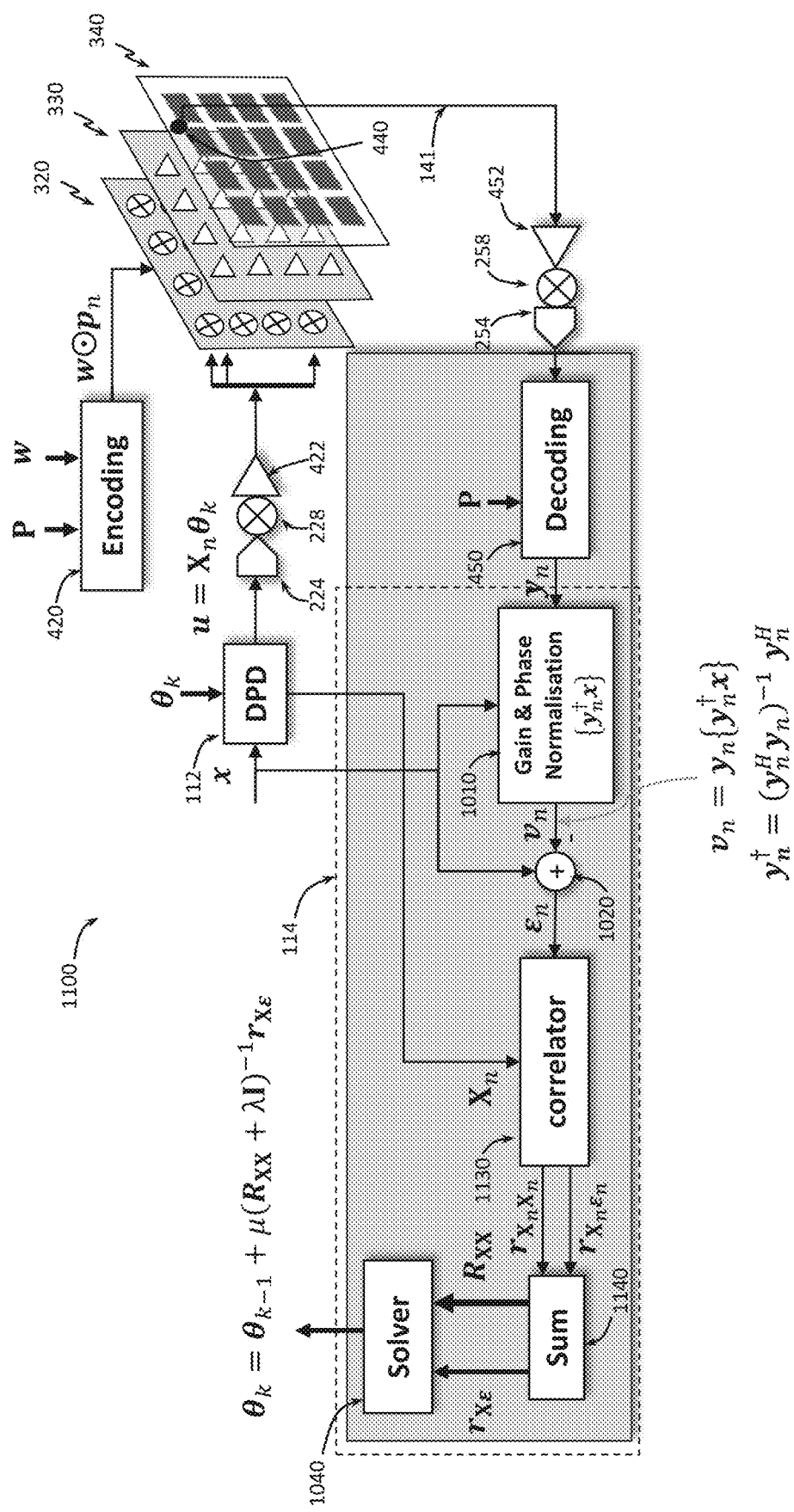
FIG. 11 provides a schematic block diagram illustrating an RF transceiver similar to that shown in FIG. 4, further configured to perform sequential adaptation in DPD using coding, according to some embodiments of the present disclosure.

FIG. 11 provides a schematic block diagram illustrating an RF transceiver 1100 similar to that shown in FIG. 4, further configured to perform sequential adaptation in DPD using coding, according to some embodiments of the present disclosure. The RF transceiver 1100 may be configured to perform the operations as were described with reference to the RF transceiver 1000 of FIG. 10, further adding an additional operation of summing the correlation matrix and vector over (across) the coding steps (i.e., transmission of different ones of the N codes). As shown in FIG. 11, the RF transceiver 1100 may include the decoding circuit 450, the gain and phase normalization circuit 1010, the error generation circuit 1020, and the solver 1040 as described with reference to FIG. 10. In the interests of brevity, descriptions of these circuits are not repeated here.

On each coding step (i.e., on each transmission of different ones of the N codes), a correlator 1130 may be configured to evaluate the current auto-correlation matrix and the cross-correlation vector, $$r_{X_n X_n} = X_n^H X_n$$

and $$r_{X_n \varepsilon_n} = X_n^H \varepsilon_n,$$

and an adder 1140 is configured to add these to the previous correlation sums. Over the N codes, we the adder 1140 then generates the summed auto-correlation matrix $$R_{XX} = \sum_{n=1}^{N} r_{X_n X_n}$$

and summed cross-correlation vector $$r_{X\varepsilon} = \sum_{n=1}^{N} r_{X_n \varepsilon_n}.$$

In general, the adder 1140 may be configured to sum the correlations over multiple coding cycles before updating the DPD coefficients or do the opposite and update the DPD taps, say ½ ways or some other fraction through the coding cycle. Indeed, the approach described with reference to FIG. 10 is a special case of the approach described with reference to FIG. 11, where in FIG. 10 the sum was computed just over 1 code step. The motivation for adding in the extra summing step of the adder 1140 can be understood in terms of averaging out unwanted transient effects on the solver 1040 that could arise, e.g., if a coding or observation step failed (due to a spurious noise burst on the probe antenna element 440 or some other unwanted transient disturbance). Summing the correlation across multiple coding steps by the adder 1140 may help to smooth out any such transient effects.

Figure 12:
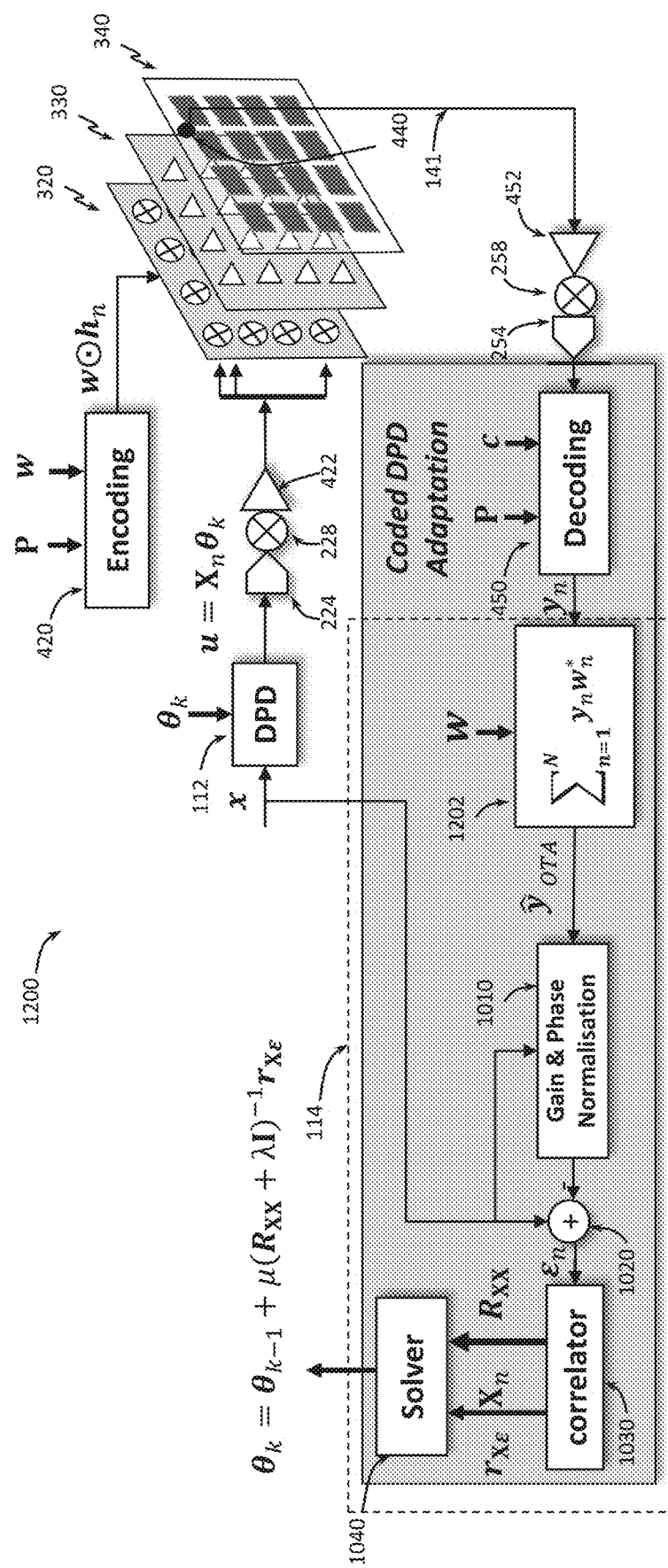
FIG. 12 provides a schematic block diagram illustrating an RF transceiver similar to that shown in FIG. 4, further configured to perform estimated over-the-air (OTA) adaptation in DPD using coding, according to some embodiments of the present disclosure.

FIG. 12 provides a schematic block diagram illustrating an RF transceiver 1200 similar to that shown in FIG. 4, further configured to perform estimated OTA adaptation in DPD using coding, according to some embodiments of the present disclosure. The RF transceiver 1200 may be configured to perform the operations as were described with reference to the RF transceiver 1000 of FIG. 10, further adding an additional operation of generating an estimate OTA response $\hat{y}_{OTA}$ based on the N feedback signals $y_n$ and then performing the gain and phase normalization and subsequent operations as described with reference to FIG. 10, but based on the generated estimate OTA response $\hat{y}_{OTA}$. The DPD coefficients θ may then be updated based on the estimate OTA response $\hat{y}_{OTA}$. As shown in FIG. 12, the RF transceiver 1200 may include the decoding circuit 450, the gain and phase normalization circuit 1010, the error generation circuit 1020, the correlator circuit 1030, and the solver 1040 as described with reference to FIG. 10. In the interests of brevity, descriptions of these circuits are not repeated here and only the differences are described.

As shown in FIG. 12, the RF transceiver 1200 may further include an estimate OTA response generation circuit 1202, configured to generate an estimate OTA response $\hat{y}_{OTA}$ based on the N feedback signals $y_n$. In some embodiments, the estimate OTA response $\hat{y}_{OTA}$ may be generated as a sum of the N feedback signals $y_n$, each of which has been multiplied by a complex conjugate of a weight $(w_n^*)$ applied to the PA input signal of a corresponding PA to perform beamforming:

$$\hat{y}_{OTA} = \sum_{n=1}^{N} y_n w_n^*.$$

Similar to the each of the N feedback signals $y_n$, the estimate OTA response $\hat{y}_{OTA}$ may be a vector of D elements, where D is the depth of the capture buffer, e.g., about 10000 samples.

In the RF transceiver 1200, the gain and phase normalization circuit 1010 may be configured to perform gain normalization and phase rotation of the estimate OTA response $\hat{y}_{OTA}$ with respect to the income signal (vector) x to produce a normalized estimate OTA response $(\hat{y}_{OTA\_norm})$ (i.e., an output of the gain and phase normalization circuit 1010) so that a sum of squares between the normalized estimate OTA response $(\hat{y}_{OTA\_norm})$ and the input signal x to the DPD actuator 112 may be reduced or minimized. The DPD coefficients θ may then be updated based on the normalized estimate OTA response $(\hat{y}_{OTA\_norm})$.

Figure 13:
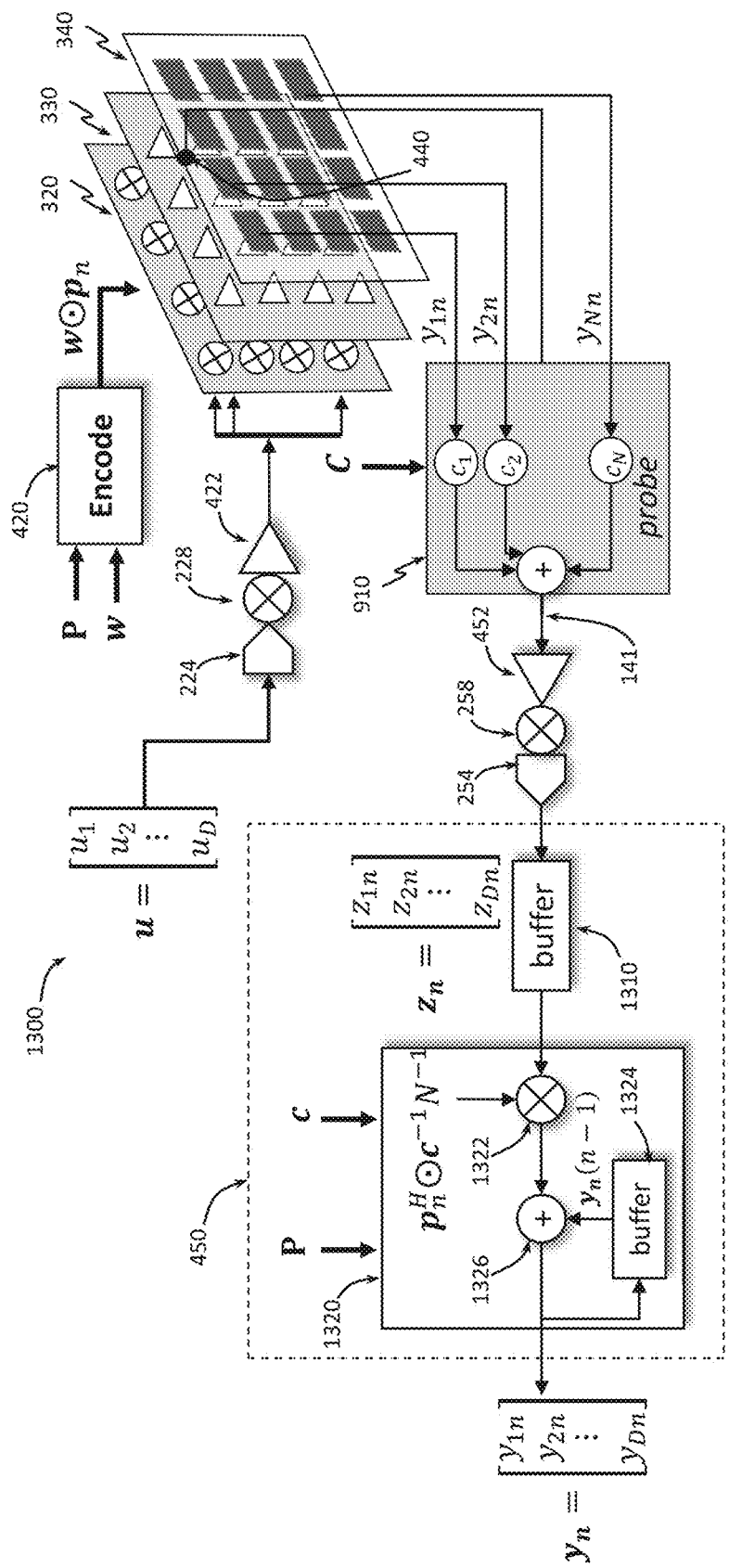
FIG. 13 provides a schematic block diagram illustrating an RF transceiver similar to that shown in FIG. 4, further configured to employ an efficient decoding buffer in performing DPD using coding, according to some embodiments of the present disclosure.

FIG. 13 provides a schematic block diagram illustrating an RF transceiver 1300 similar to that shown in FIG. 4, further configured to employ an efficient decoding buffer arrangement as a part of the decoding circuit 450, according to some embodiments of the present disclosure. As shown in FIG. 13, the efficient decoding buffer arrangement of the decoding circuit 450 may include a buffer 1310 and an iterative decoder circuit 1320. The efficient decoding buffer arrangement may replace the decoding circuit 450 in any of the embodiments describing other RF transceiver circuits described herein (e.g., in the embodiments of the RF transceiver circuits described with reference to FIG. 4, or any of FIGS. 9-12). FIG. 13 illustrates a model of the probe 910 as was described with reference to FIG. 9, just to illustrate again that the feedback signal 141 is a combination of individual responses from various antenna elements 342 and their respective coupling coefficients c. When the individual digital feedback signals $y_n$ are generated at the same time, a buffer the size of N×D is needed (e.g., 16×10000, if the number of codes N is 16 and the number D of samples used for DPD training is 10000). The efficient decoding buffer arrangement may advantageously allow reducing the size of such a buffer to 2×D. To that end, the buffer 1310 may be configured to store a single vector of captured values $z_n$ of the capture array Z for a given value of n (i.e., for the transmission of a given code n of the N codes). Thus, the size of the buffer 1310 may be 1×D because the vector $z_n$ is a vector of D elements (the size of the predistorted signal u used by the DPD adaptation circuit 114 is also D, as is illustrated in FIG. 13). The iterative decoder circuit 1320 may then use the vector $z_n$ to generate the digital feedback signal $y_n$ for this value of n. In particular, in some embodiments, the iterative decoder circuit 1320 may include a multiplier 1322, a further buffer 1324, and an adder 1326. The multiplier 1322 may be configured to multiply the vector $z_n$, received from the buffer 1310, by $$p_n^H \odot c^{-1} N^{-1}, \text{ where } p_n^H$$

is the Hermitian transpose of a nth encoding column of the encoding matrix P, $c^{-1}$ is an inverse of the vector c of coupling coefficients, $N^{-1}$ is 1/N. A digital feedback signal for the previous code, i.e., $y_n(n-1)$, may be stored in the further buffer 1324, and may then be provided to the adder 1326 that is configured to combine (e.g., add), the digital feedback signal for the previous code, $y_n(n-1)$, and the output of the multiplier 1322 to generate the digital feedback signal $y_n$ for the present code, $y_n(n)$. Thus, at all times, the number of 1×D buffers needed for storage of data indicative of the digital feedback signals $y_n$ may be 2 one is the buffer 1310 and one is the buffer 1324. The iterative decoding may be applied N, at which time the output will be fully decoded.

Figure 14:
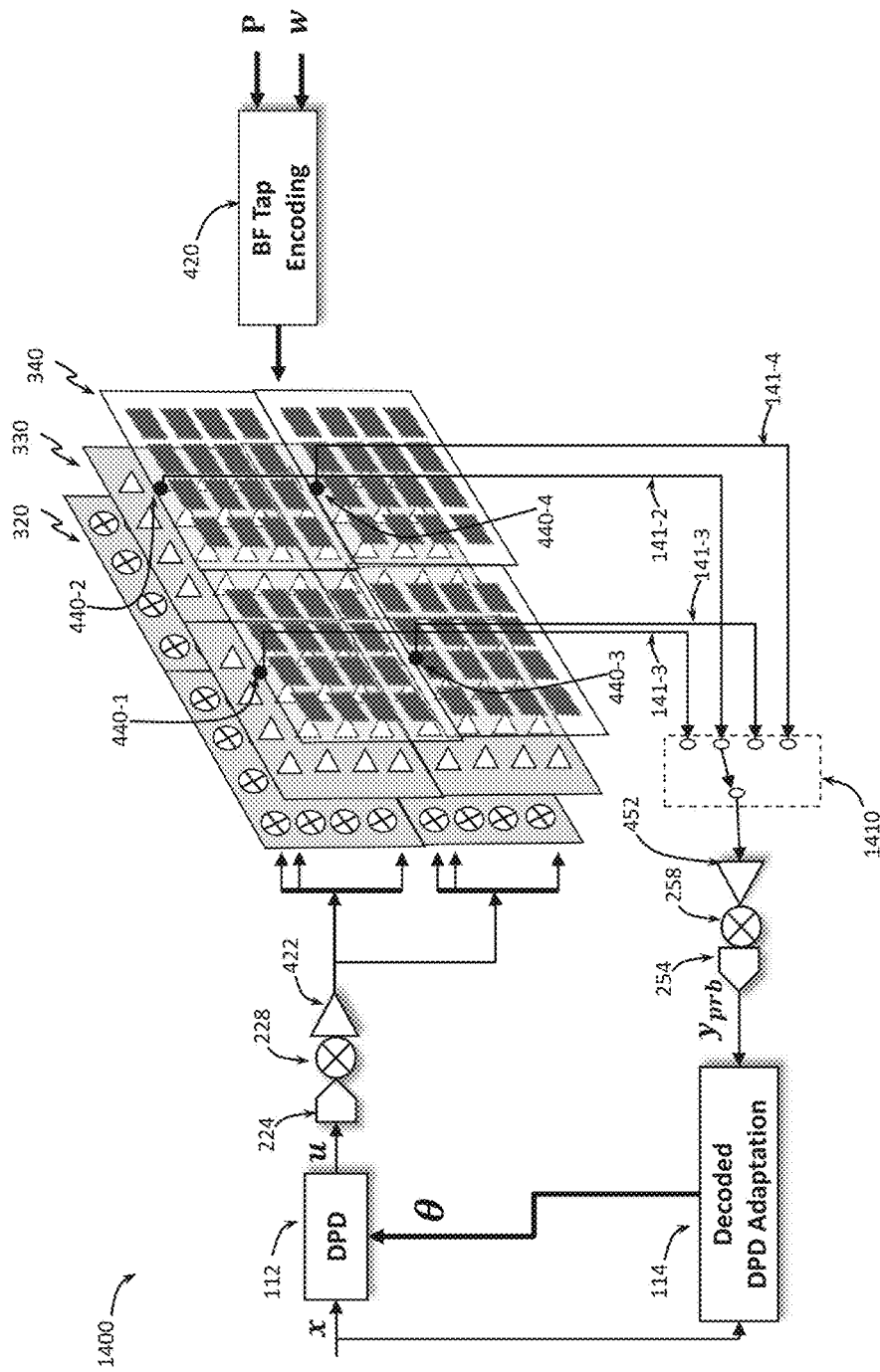
FIG. 14 provides a schematic block diagram illustrating an RF transceiver similar to that shown in FIG. 4, further configured to perform multi-probe DPD adaptation using coding, according to some embodiments of the present disclosure.

FIG. 14 provides a schematic block diagram illustrating an RF transceiver 1400, configured to perform multi-probe DPD adaptation using coding, according to some embodiments of the present disclosure. The RF transceiver 1400 may be any of the RF transceivers described herein, except that it illustrates that, in some embodiments, multiple probe antenna elements 440 may be used, shown in FIG. 14 with an example of 4 such probe antenna elements, 440-1 through 440-4, each of which may result in a feedback signal 141, shown as signals 141-1 through 141-4. The RF transceiver 1400 may further include a switch 1410, configured to switch which one of the feedback signals 141-1 through 141-4 is processed to update the DPD coefficients in any of the manners described herein. In other embodiments of the RF transceiver 1400, the number of probes 440 may be other than 4, each associated with a number of PAs 332 other than 16.

Figure 15:
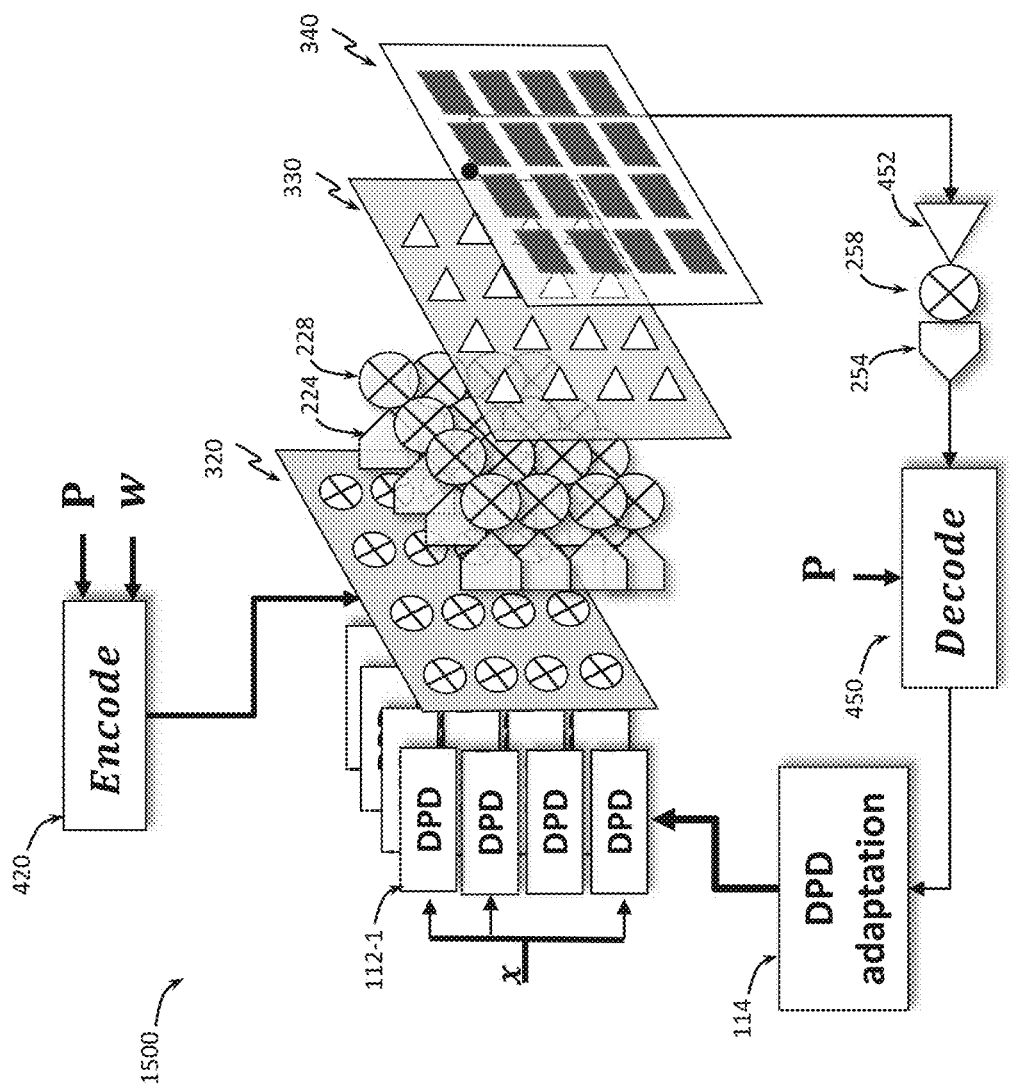
FIG. 15 provides a schematic block diagram illustrating an RF transceiver similar to that shown in FIG. 4, configuring to perform coding in a digital domain, according to some embodiments of the present disclosure.

FIG. 15 provides a schematic block diagram illustrating an RF transceiver 1500, configuring to perform coding in a digital domain, according to some embodiments of the present disclosure. FIG. 15 illustrates that in case coding is performed in a digital domain, i.e., the DAC 224 and the upconverting mixer 228 are provided after the beamformer array 320 and the encoding circuit 420, the DPD actuator 112 may be implemented as a plurality of DPD actuators 112-1 through 112-N, with a respective DPD actuator 112 for each of the digital pathways to one of the corresponding beamformer taps 322. In such embodiments, a respective pair of the DAC 224 and the upconverting mixer 228 may be implemented at the output of each of the beamformer taps 322. Thus, there would be N DPD actuators 112 and N pairs of the DAC 224 and the upconverting mixer 228. The decoding circuit 450 and the DPD adaptation circuits 114 may then use the coding to perform DPD according to any of the embodiments described herein.

Figure 16:
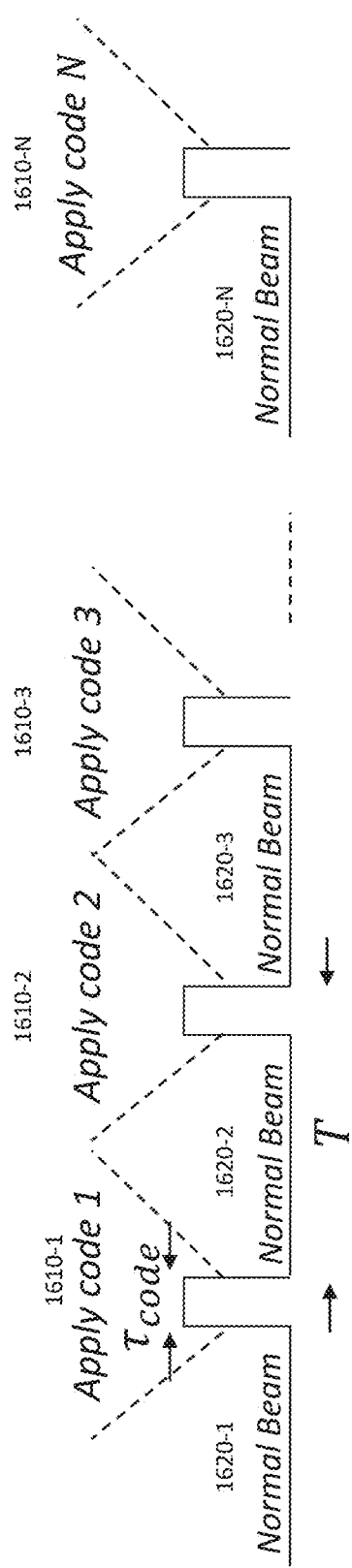
FIG. 16 provides an example illustration of duty cycled transmission of codes when performing DPD using coding, according to some embodiments of the present disclosure.

As described above, transmission of some codes may compromise transmission of actual data, e.g., when codes are encoded during live transmission of actual data, e.g., when the codes are orthogonal codes. FIG. 16 provides an example illustration of duty cycled transmission of codes when performing DPD using coding, according to some embodiments of the present disclosure. FIG. 16 illustrates time periods 1610 when one of the N codes are transmitted, i.e., shown as N time periods 1610-1 through 1610-N, interspersed with time periods 1620 when no codes are transmitted and normal beamforming (i.e., without the added encoding) is performed, which may help spread and hence control (minimize) the disturbance on the beam pattern due to coding across time. Thus, a duty cycle for sending codes is the time T which is the sum of one of the time periods 1610 and one of the time periods 1620, and the total time it takes to transmit N codes is N*T. In some implementations of 4G or 5G communication systems, the transmission of data may be broken down into frames of a certain time duration, e.g., 10 milliseconds (ms) long, where each frame may further be subdivided into 1 ms long subframes and then into 0.5 ms slots and, finally, into 4 microseconds (us) symbol periods. In some embodiments, the N codes may be transmitted sequentially by, e.g., transmitting one code for the duration of 1 symbol period per frame (i.e., the first code is transmitted for the duration of 1 symbol period of a first frame, the second code is transmitted for the duration of 1 symbol period of a second frame, which may but does not have to be consecutive with the first frame, and so on). In such embodiments, the codes would be transmitted at a ratio or duty cycle of 1 in 2500 (which is the ratio between 4 us symbol period and 10 ms frame length). For this example, 16 codes (i.e., if N=16) could be transmitted over the duration of 16 frames, so in about 160 ms. When the codes are duty cycled in this manner, and the duration of the time period 1610 is sufficiently small compared to the duration of the time period 1620, even the beam disturbance due to the use of orthogonal coding may be acceptable. The duty cycling of codes may, however, be also used with non-orthogonal codes. In general, the duty cycling as shown in FIG. 16 may be applied to performing DPD using coding with any of the RF transceivers described herein.

FIG. 17 provides an example illustration of transmitting codes during TX-to-RX transition when performing DPD using coding, according to some embodiments of the present disclosure. In some embodiments of frequency-division duplex (FDD) RF transceivers, some or all of the codes could be transmitted during the TX-to-RX transition. For example, the time period between TX and RX may be a time period 1710, shown in FIG. 17, which may, e.g., be about 3 um in some embodiments. The time period 1710 may be broken down into a time period 1720-1 for encoding a code (e.g., one of the N codes) and capturing wireless RF signals transmitted by the antenna elements 342 when the code is encoded, and a time period 1720-2 for updating the DPD coefficients, or at least for performing preliminary calculations that lead to the update of the DPD coefficients later on, based on the signals generated by the one or more probe antenna elements 440 as described herein. The next code may then be transmitted during another TX-to-RX transition, which may be consecutive transition with the first one, or may happen at a later point in time.

Example RF Devices and Systems

In some embodiments, DPD using coding as described herein may be included in various RF devices and systems used in wireless communications. For illustration purposes only, one example RF device that may include any of the coded DPD arrangements described herein is shown in FIG. 18 and described below. However, in general, DPD using coding as described herein may be included in systems other than radio communications, such as in acoustic systems, sonar imaging, or any other systems where beamforming is used and where some components may exhibit nonlinear behavior, all of which being within the scope of the present disclosure.

FIG. 18 is a block diagram of an example RF device 2200, e.g., an RF transceiver, in which DPD using coding may be implemented, according to some embodiments of the present disclosure.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a BS or a UE device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as MRI.

In various embodiments, the RF device 2200 may be included in FDD or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 18 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SOC) die.

Additionally, in various embodiments, the RF device 2200 may not include one or more of the components illustrated in FIG. 18, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 18, the RF device 2200 may include an antenna 2202, a duplexer 2204 (e.g., if the RF device 2200 is an FDD RF device; otherwise the duplexer 2204 may be omitted), a local oscillator 2206, a digital processing unit 2208. As also shown in FIG. 18, the RF device 2200 may include an RX path that may include an RX path amplifier 2212, an RX path pre-mix filter 2214, a RX path mixer 2216, an RX path post-mix filter 2218, and an ADC 2220. As further shown in FIG. 18, the RF device 2200 may include a TX path that may include a TX path amplifier 2222, a TX path post-mix filter 2224, a TX path mixer 2226, a TX path pre-mix filter 2228, and a DAC 2230. Still further, the RF device 2200 may further include an impedance tuner 2232, an RF switch 2234, and control logic 2236. In various embodiments, the RF device 2200 may include multiple instances of any of the components shown in FIG. 18. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 18) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 18 as control logic 2236, e.g., an RF FE control interface. In some embodiments, the control logic 2236 may be configured to control at least portions of performing DPD using coding, as described herein, e.g., to help linearize the TX path amplifier 2222 of the RF device 2200 when the TX path amplifier 2222 includes an array of PAs, e.g., the array 330 of the PAs 332 as described herein. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 18, in some embodiments, the RF device 2200 may further include a memory device, configured to cooperate with the digital processing unit 2208.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 18, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a bandpass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may include an array of PAs, e.g., the array 330 of the PAs 332, and may be implemented together with any of the coded DPD arrangements described herein, where DPD using coding for phased antenna arrays may be used to provide predistorted input signals to the TX path amplifier 2222.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 18, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 18 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Example Data Processing System

Figure 19:
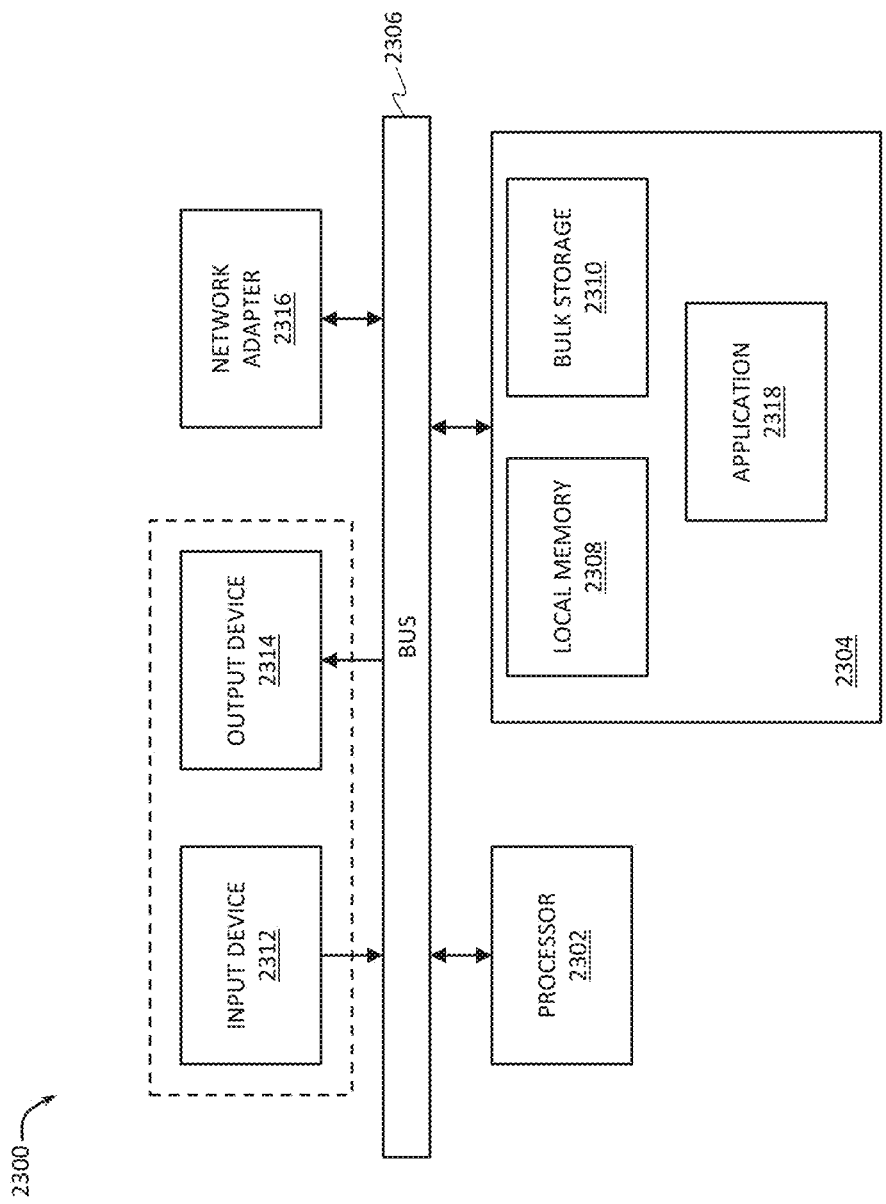
FIG. 19 provides a block diagram illustrating an example data processing system that may be configured to implement, or control, at least portions of performing DPD using coding for phased antenna arrays, according to some embodiments of the present disclosure.

FIG. 19 provides a block diagram illustrating an example data processing system 2300 that may be configured to control operation of one or more coded DPD arrangements as described herein, according to some embodiments of the present disclosure. For example, the data processing system 2300 may be configured to implement or control portions of performing DPD using coding as described with reference to FIGS. 1-18, in particular to implement or control portions of coded DPD arrangements as illustrated in FIG. 4 and FIGS. 9-17, or any further embodiments of the coded DPD arrangements as described herein. In another example, the data processing system 2300 may be configured to implement at least portions of the control logic 2236, shown in FIG. 18.

As shown in FIG. 19, the data processing system 2300 may include at least one processor 2302, e.g. a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to performing DPD using coding as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating coded DPD arrangements for performing DPD using coding as shown in FIGS. 1-4 and FIGS. 9-18, can also include suitable interfaces for receiving, transmitting, and/or otherwise communicating data or information in a network environment so that they can communicate with, e.g., the data processing system 2300.

In certain example implementations, mechanisms performing DPD using coding as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 2304 shown in FIG. 19, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 2302 shown in FIG. 19, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 19, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 19) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 19 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

Select Examples

FIGS. 1-19 illustrate various aspects of DPD arrangements that use coding to differentiate between contributions from individual PAs (i.e., coded DPD arrangements). When used with a phased antenna array having N antenna elements and N corresponding PAs, the coded DPD arrangements described herein may sequentially apply N codes to input signals provided to N PAs. Each code is a vector having N elements, where each element corresponds to a different PA in that the element is a complex gain applied to an input signal for the PA. Together, the N codes may be arranged as N rows or N columns of a matrix P. The coded DPD arrangements described herein may generate N feedback signals by applying the matrix P to a signal generated by a probe antenna element sensing wireless RF signals transmitted by the N antenna elements, and to update DPD coefficients based on the N feedback signals. The N codes may be either orthogonal or non-orthogonal.

The following paragraphs provide various examples of the embodiments disclosed herein.

Example 1 provides a coded DPD arrangement for use with a phased antenna array having N antenna elements configured to transmit wireless signals based on outputs from corresponding ones of N PAs of a PA array. The PAs may include amplifiers such as Doherty amplifiers, class A amplifiers, class B amplifiers, class AB amplifiers, class C amplifiers, or any combination of these PAs. The coded DPD arrangement includes a DPD actuator circuit, a coded beamformer circuit, and a DPD adaptation circuit. The DPD actuator circuit is configured to use DPD coefficients ($\theta$) to perform a predistortion of an input signal (x) to generate one or more predistorted signals (u). The coded beamformer circuit is configured to sequentially apply N codes to PA input signals to be amplified by the N PAs to produce the outputs from the N PAs, where, for each of the N codes, a code is a vector having N elements (i.e., each vector is a 1×N matrix) where each element corresponds to a different one of the N PAs in that the each element is a complex gain applied to a PA input signal to be amplified by the corresponding one of the N PAs at the time when the code is applied, the PA input signals are based on the one or more predistorted signals (u), and a matrix P includes the N codes arranged as N rows or N columns of the matrix P (i.e., the matrix P is a square matrix N×N). The DPD adaptation circuit is configured to generate N feedback signals ($y_n$, where n is an integer between 1 and N), by applying the matrix P to digital signals based on signals generated by a probe antenna element configured to sense the wireless signals transmitted by at least a subset of the N antenna elements based on the PA input signals to which the coded beamformer circuit sequentially applied the N codes, and update DPD coefficients ($\theta$) based on the N feedback signals.

Example 2 provides the coded DPD arrangement according to example 1, where the probe antenna element is one of the N antenna elements or an additional antenna element provided on a single substrate with the N antenna elements.

Example 3 provides the coded DPD arrangement according to examples 1 or 2, where the probe antenna element is configured to perform one or more of near-field measurements, surface-wave coupling measurements, or substrate coupling measurements of the wireless signals transmitted by at least the subset of the N antenna elements when the coded beamformer circuit sequentially applies the N codes.

Example 4 provides the coded DPD arrangement according to examples 1 or 2, where the probe antenna element is configured to perform a far-field measurements of the wireless signals transmitted by at least the subset of the N antenna elements when the coded beamformer circuit sequentially applies the N codes.

Example 5 provides the coded DPD arrangement according to any one of the preceding examples, where, for at least one element of the N codes, the complex gain of the at least one element is configured to adjust a phase of a corresponding one of the PA input signals by an angle having an absolute value greater than 0 degrees and less than about 45 degrees, e.g., less than about 40 degrees.

Example 6 provides the coded DPD arrangement according to any one of the preceding examples, where the DPD adaptation circuit is further configured to generate N normalized feedback signals ($v_n$) by performing one or more of gain and phase normalization of the N feedback signals by performing gain and phase adjustment/rotation of the N feedback signals ($y_n$) so that, for each normalized feedback signal $v_n$, a sum of squares between the normalized feedback signal $v_n$ and the input signal x to the DPD actuator is minimized, and the DPD coefficients ($\theta$) are updated based on the N normalized feedback signals.

Example 7 provides the coded DPD arrangement according to any one of the preceding examples, where the DPD adaptation circuit is further configured to generate an estimate OTA response ($\hat{y}_{OTA}$) based on the N feedback signals ($y_n$), and the DPD coefficients ($\theta$) are updated based on the estimate OTA response.

Example 8 provides the coded DPD arrangement according to example 7, where the DPD adaptation circuit is further configured to generate a normalized estimate OTA response ($\hat{y}_{OTA\_norm}$) by performing one or more of gain and phase normalization of the estimate OTA response ($\hat{y}_{OTA}$) so that a sum of squares between the normalized estimate OTA response ($\hat{y}_{OTA\_norm}$) and the input signal (x) to the DPD actuator is minimized, and the DPD coefficients ($\theta$) are updated based on the normalized estimate OTA response.

Example 9 provides the coded DPD arrangement according to examples 7 or 8, where the estimate OTA response is generated as a sum of the N feedback signals ($y_n$), each of which has been multiplied by a complex conjugate of a weight applied to the PA input signal of a corresponding PA to perform beamforming.

Example 10 provides the coded DPD arrangement according to any one of examples 7-9, where each of the N feedback signals ($y_n$) and the estimate OTA response is a vector of D elements (i.e., an 1×D matrix), where D is a number of captures to be used to updated the DPD coefficients.

Example 11 provides the coded DPD arrangement according to any one of the preceding examples, where the N feedback signals are generated by the DPD adaptation circuit further applying estimates of N coupling coefficients ($c_n$, where n is an integer between 1 and N and $c_n$ is a complex scalar number), where each coupling coefficient corresponds to a different one of the N PAs and is indicative of a portion of a wireless signal, transmitted by one of the antenna elements that corresponds to the one of the PAs, that is coupled to an output of the probe antenna element when the probe antenna element senses the wireless signals transmitted by the at least the subset of the N antenna elements.

Example 12 provides the coded DPD arrangement according to any one of the preceding examples, where a feedback signal $y_n$ of the N feedback signals is generated based on a signal generated by the probe antenna element sensing the wireless signals transmitted by at least the subset of the N antenna elements based on the PA input signals to which the coded beamformer circuit applied a code n of the N codes and further based on a feedback signal $y_{n-1}$ of the N feedback signals that was generated based on a signal generated by the probe antenna element sensing the wireless signals transmitted by at least the subset of the N antenna elements based on the PA input signals to which the coded beamformer circuit applied a code n−1 of the N codes.

Example 13 provides the coded DPD arrangement according to any one of the preceding examples, where, for each of the N codes, the coded beamformer circuit is configured to apply the code in a time period that is separated from a time period of applying a previous or a next code by a no-code time period that is at least about 2000 times longer, e.g, at least about 2500 times longer, than the time period for applying the code, and the coded beamformer circuit is configured to not apply any of the N codes during the no-code time period associated with each of the N codes.

Example 14 provides the coded DPD arrangement according to any one of examples 1-13, where the N codes are applied to the PA input signals in an analog domain.

Example 15 provides the coded DPD arrangement according to any one of examples 1-13, where the N codes are applied to the PA input signals in a digital domain. In some such examples, the encoding can be a number of different quasi-orthogonal coding techniques such as Walsh-Hadamard codes, Hamming codes, etc.

Example 16 provides the coded DPD arrangement according to any one of examples 1-13, where the N codes are applied to the PA input signals partially in a digital domain and partially in an analog domain.

A further example provides the coded DPD arrangement according to any one of examples 14-16, wherein the N codes are applied to the N PA input signals as complex gain or frequency encoding, or a combination of these.

Example 17 provides the coded DPD arrangement according to any one of examples 1-16, where the matrix P is such that a 2-norm of a matrix that is a result of subtracting an identity matrix from a multiple of a Hermitian transpose of the matrix P by the matrix P is greater than zero (i.e., the N codes are non-orthogonal codes).

Example 18 provides the coded DPD arrangement according to any one of examples 1-16, where the N codes are orthogonal codes.

Example 19 provides a coded digital predistortion (DPD) arrangement for use with a phased antenna array having N antenna elements configured to transmit wireless signals based on outputs from corresponding ones of N PAs of a PA array. The coded DPD arrangement includes a coded beamformer circuit, configured to sequentially apply N codes to PA input signals to be amplified by the N PAs to produce the outputs from the N PAs. The coded DPD arrangement further includes a DPD adaptation circuit, configured to generate N feedback signals ($y_n$, where n is an integer between 1 and N), by applying the N codes to a digital signal based on a signal generated by a probe antenna element configured to sense the wireless signals transmitted by at least a subset of the N antenna elements based on the PA input signals to which the coded beamformer circuit sequentially applied the N codes, and update DPD coefficients ($\theta$) based on the N feedback signals. The coded DPD arrangement also includes a DPD actuator circuit, configured to use the DPD coefficients to perform one or more of a predistortion of the PA input signals to be amplified by the N PAs to produce the outputs from the N PAs and a predistortion of bias signals to bias the N PAs to produce the outputs from the N PAs.

Example 20 provides the coded DPD arrangement according to example 19, where the DPD adaptation circuit is further configured to generate N normalized feedback signals ($v_n$) by performing one or more of gain and phase normalization of the N feedback signals, and the DPD coefficients ($\theta$) are updated based on the N normalized feedback signals.

Example 21 provides the coded DPD arrangement according to examples 19 or 20, further including features of the coded DPD arrangement according to any one of examples 1-18.

Example 22 provides an RF device, e.g., an RF transceiver or a portion thereof, that includes a PA array and a coded DPD arrangement. The PA array includes N PAs, to be used with a phased antenna array having N antenna elements configured to transmit wireless signals based on outputs from corresponding ones of the N PAs. The coded DPD arrangement is a coded DPD arrangement according to any one of the preceding examples.

Example 23 provides the RF device according to example 22, further including the phased antenna array.

Example 24 provides the RF device according to examples 22 or 23, further including a control logic configured to control operation of the coded DPD arrangement.

Example 25 provides the RF device according to any one of examples 22-24, where the RF device is a mobile device (e.g., a UE of a wireless cellular network).

Example 26 provides the RF device according to any one of examples 22-24, where the RF device is a BS of a wireless cellular network or a transmitter of a cable communications network.

Example 27 provides a non-transitory computer-readable storage medium, storing computer-readable instructions which, when executed by a processor, are configured to control operation of the coded DPD arrangement as described herein.

VARIATIONS AND IMPLEMENTATIONS

While embodiments of the present disclosure were described above with references to exemplary implementations as shown in FIGS. 1-19, a person skilled in the art will realize that the various teachings described above are applicable to a large variety of other implementations. For example, descriptions provided herein are applicable not only to 5G systems, which provide one example of wireless communication systems, but also to other wireless communication systems such as, but not limited to, Wi-Fi technology or Bluetooth technology. In yet another example, descriptions provided herein are applicable not only to wireless communication systems, but also to any other systems where amplifiers may be used, such as radar systems, automotive radar, and cable communication systems (e.g., cable television systems, etc.).

In certain contexts, the features discussed herein can be applicable to automotive systems, medical systems, scientific instrumentation, wireless and wired communications, radio, radar, and digital-processing-based systems.

In the discussions of the embodiments above, components of a system, such as phase shifters, frequency mixers, transistors, resistors, capacitors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to performing DPD using coding as described herein.

Parts of various systems for performing DPD using coding, as proposed herein, can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-19) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to performing DPD using coding as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. A digital predistortion (DPD) arrangement for use with a phased antenna array having N antenna elements to transmit wireless signals based on outputs from corresponding ones of N power amplifiers (PAs) of a power amplifier array, the DPD arrangement comprising:
  a DPD actuator circuit, to use DPD coefficients ($\theta$) to perform a predistortion of an input signal (x) to generate one or more predistorted signals (u);
  a beamformer circuit, to apply N codes to PA input signals to be amplified by the N PAs to produce the outputs from the N PAs, where:
    a code of the N codes is a vector having N elements, where each element of the N elements corresponds to a different one of the N PAs,
    the PA input signals are based on the one or more predistorted signals (u), and
    a matrix P includes the N codes arranged as N rows or N columns of the matrix P; and
  an adaptation circuit, to:
    generate N feedback signals based on the matrix P, and
    update DPD coefficients ($\theta$) based on the N feedback signals.

2. The DPD arrangement according to claim 1, wherein:
  the adaptation circuit is further to generate N normalized feedback signals ($v_n$) by performing one or more of gain and phase normalization of the N feedback signals, and
  the DPD coefficients ($\theta$) are updated based on the N normalized feedback signals.

3. The DPD arrangement according to claim 1, wherein:
  the adaptation circuit is further to generate an estimate over-the-air (OTA) response ($\hat{y}_{OTA}$) based on the N feedback signals ($y_n$), and
  the adaptation circuit is to update DPD coefficients ($\theta$) based on the estimate OTA response.

4. The DPD arrangement according to claim 3, wherein:
  the adaptation circuit is further to generate a normalized estimate OTA response ($\hat{y}_{OTA\_norm}$) by performing one or more of gain and phase normalization of the estimate OTA response ($\hat{y}_{OTA}$), and
  the adaptation circuit is to update DPD coefficients ($\theta$) based on the normalized estimate OTA response.

5. The DPD arrangement according to claim 3, wherein the estimate OTA response is indicative of a sum of the N feedback signals ($y_n$), each of which has been multiplied by a complex conjugate of a weight applied to the PA input signal of a corresponding PA to perform beamforming.

6. The DPD arrangement according to claim 3, wherein each of the N feedback signals ($y_n$) and the estimate OTA response is a vector of D elements, where D is a number of captures to be used to updated the DPD coefficients.

7. The DPD arrangement according to claim 1, wherein the N feedback signals are generated by the adaptation circuit by applying estimates of N coupling coefficients, where each coupling coefficient corresponds to a different one of the N PAs and is indicative of a portion of a wireless signal, transmitted by one of the antenna elements that corresponds to the one of the PAs, that is coupled to an output of the probe antenna element when the probe antenna element senses the wireless signals transmitted by the at least the subset of the N antenna elements.

8. The DPD arrangement according to claim 1, wherein:
  for each of the N codes, the beamformer circuit is to apply the code in a time period that is separated from a time period of applying a previous or a next code by a no-code time period that is at least about 2000 times longer, than the time period for applying the code, and the beamformer circuit is to not apply any of the N codes during the no-code time period associated with each of the N codes.

9. The DPD arrangement according to claim 1, wherein the matrix P is such that a 2-norm of a matrix that is a result of subtracting an identity matrix from a multiple of a Hermitian transpose of the matrix P by the matrix P is greater than zero.

10. The DPD arrangement according to claim 1, wherein the N codes are orthogonal codes.

11. The DPD arrangement according to claim 1, wherein the beamformer circuit is to sequentially apply the N codes to the PA input signals.

12. The DPD arrangement according to claim 1, wherein at least one element of the N elements is a complex gain.

13. The DPD arrangement according to claim 1, wherein the each element of the N elements corresponds to the different one of the N PAs in that the each element is a complex gain applied to a PA input signal to be amplified by the corresponding one of the N PAs at the time when the code is applied.

14. The DPD arrangement according to claim 1, wherein the adaptation circuit is to generate the N feedback signals based on the matrix P by applying the matrix P to signals based on signals generated by a probe antenna element to sense the wireless signals transmitted by at least a subset of the N antenna elements based on the PA input signals to which the coded beamformer circuit applied the N codes.

15. The DPD arrangement according to claim 2, wherein the adaptation circuit is to generate N normalized feedback signals ($v_n$) so that, for each normalized feedback signal $v_n$, a sum of squares between the normalized feedback signal $v_n$ and the input signal x to the DPD actuator is reduced or minimized.

16. The DPD arrangement according to claim 4, wherein the adaptation circuit is to generate the normalized estimate OTA response (($\hat{y}_{OTA\_norm}$) so that a sum of squares between the normalized estimate OTA response ($\hat{y}_{OTA\_norm}$) and the input signal (x) to the DPD actuator is reduced or minimized.

17. The DPD arrangement according to claim 12, wherein, the complex gain of the at least one element is to adjust a phase of a corresponding one of the PA input signals by an angle having an absolute value greater than 0 degrees and less than about 45 degrees.

18. The coded DPD arrangement according to claim 14, wherein a feedback signal $y_n$ of the N feedback signals is generated based on a signal generated by the probe antenna element sensing the wireless signals transmitted by at least the subset of the N antenna elements based on the PA input signals to which the coded beamformer circuit applied a code n of the N codes and further based on a feedback signal $y_{n-1}$ of the N feedback signals that was generated based on a signal generated by the probe antenna element sensing the wireless signals transmitted by at least the subset of the N antenna elements based on the PA input signals to which the coded beamformer circuit applied a code n−1 of the N codes.

19. A digital predistortion (DPD) arrangement, comprising:
  a beamformer circuit, to apply N codes to N power amplifiers (PAs) to produce N PA outputs, where each code of the N codes is applied to a different PA of the N PAs to cause the different PA to produce a different PA output of the N PA outputs; and
  an adaptation circuit, to:
    generate N feedback signals ($y_n$) by applying the N codes to a signal based on a probe signal generated by a probe antenna element, the probe signal indicative of wireless signals transmitted by at least a subset of N antenna elements based on the N PA outputs, and
    update DPD coefficients (θ) based on the N feedback signals.

20. The DPD arrangement according to claim 19, wherein the N codes are orthogonal codes.

21. The DPD arrangement according to claim 19, wherein:
  a matrix P includes the N codes arranged as N rows or N columns of the matrix P, and
  the N feedback signals ($y_n$) are generated based on the matrix P.

22. The DPD arrangement according to claim 19, wherein the N codes are such that, when the N codes are arranged as N rows or N columns of a matrix P, the matrix P is such that a 2-norm of a matrix that is a result of subtracting an identity matrix from a multiple of a Hermitian transpose of the matrix P by the matrix P is greater than zero.

23. The DPD arrangement according to claim 19, wherein the adaptation circuit is further to generate N normalized feedback signals ($v_n$) by performing one or more of gain and phase normalization of the N feedback signals, and to update the DPD coefficients (θ) based on the N normalized feedback signals.

24. The DPD arrangement according to claim 19, further including an actuator circuit, to use the DPD coefficients to perform a predistortion of input signals to be amplified by the N PAs to produce the N PA outputs.

25. The DPD arrangement according to claim 19, further including an actuator circuit, to use the DPD coefficients to perform a predistortion of bias signals to bias the N PAs to produce the N PA outputs.

26. A processor-implemented method for performing digital predistortion (DPD), the method comprising:
  applying N codes to N power amplifiers (PAs) to produce N PA outputs, where each code of the N codes is applied to a different PA of the N PAs to cause the different PA to produce a different PA output of the N PA outputs;
  generating N feedback signals ($y_n$) by applying the N codes to a signal based on a probe signal generated by a probe antenna element, the probe signal indicative of wireless signals transmitted by at least a subset of N antenna elements based on the N PA outputs;
  updating DPD coefficients (θ) based on the N feedback signals; and
  performing DPD using the DPD coefficients.

27. The method according to claim 26, wherein the N codes are orthogonal codes.

28. The method according to claim 26, wherein the N codes are such that, when the N codes are arranged as N rows or N columns of a matrix P, the matrix P is such that a 2-norm of a matrix that is a result of subtracting an identity matrix from a multiple of a Hermitian transpose of the matrix P by the matrix P is greater than zero.

29. The method according to claim 26, wherein performing DPD using the DPD coefficients includes applying the DPD coefficients to perform a predistortion of input signals to be amplified by the N PAs to produce the N PA outputs.

30. The method according to claim 26, wherein performing DPD using the DPD coefficients includes applying the DPD coefficients to perform a predistortion of bias signals to bias the N PAs to produce the N PA outputs.

* * * * *